United States Patent
Drogi et al.

(10) Patent No.: US 8,032,097 B2
(45) Date of Patent: Oct. 4, 2011

(54) AMPLITUDE ERROR DE-GLITCHING CIRCUIT AND METHOD OF OPERATING

(75) Inventors: Serge F. Drogi, Flagstaff, AZ (US); Vikas Vinayak, Menlo Park, CA (US); Martin A. Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 931 days.

(21) Appl. No.: 11/670,402

(22) Filed: Feb. 1, 2007

(65) Prior Publication Data
US 2007/0184795 A1 Aug. 9, 2007

Related U.S. Application Data

(63) Continuation-in-part of application No. 11/429,119, filed on May 4, 2006.

(60) Provisional application No. 60/764,947, filed on Feb. 3, 2006.

(51) Int. Cl.
*H04B 1/04* (2006.01)
(52) U.S. Cl. ............ 455/127.5; 455/119; 455/126; 455/108
(58) Field of Classification Search .......... 455/26, 455/127.2, 127.3, 114.3, 125–126; 330/278, 330/285, 291, 10, 149, 129, 136
See application file for complete search history.

(56) References Cited

U.S. PATENT DOCUMENTS

| | | | |
|---|---|---|---|
| 3,900,823 A | * | 8/1975 | Sokal et al. ............ 455/126 |
| 4,262,264 A | | 4/1981 | Vandegraaf |
| 4,420,723 A | | 12/1983 | de Jager |
| 4,591,800 A | * | 5/1986 | Opas ............ 330/86 |
| 4,631,491 A | | 12/1986 | Smithers |
| 4,754,260 A | | 6/1988 | Nelson et al. |
| 5,023,937 A | * | 6/1991 | Opas ............ 455/126 |
| 5,087,829 A | | 2/1992 | Ishibashi et al. |
| 5,128,629 A | | 7/1992 | Trinh |
| 5,142,240 A | | 8/1992 | Isota et al. |
| 5,305,468 A | * | 4/1994 | Bruckert et al. ............ 455/69 |
| 5,410,276 A | | 4/1995 | Hwang et al. |
| 5,590,408 A | | 12/1996 | Weiland et al. |

(Continued)

FOREIGN PATENT DOCUMENTS

EP 0473299 A2 3/1992

(Continued)

OTHER PUBLICATIONS

"The Changing Face of Amplifier Design"; NUJIRA; (Online) Website: http://www.nujira.com/technology/.

(Continued)

*Primary Examiner* — Edward Urban
*Assistant Examiner* — Ganiyu Hanidu
(74) *Attorney, Agent, or Firm* — Fenwick & West LLP

(57) ABSTRACT

A power amplifier controller circuit controls a power amplifier based upon an amplitude correction signal indicating the amplitude difference between the amplitude of the input signal and an attenuated amplitude of the output signal. The power amplifier controller circuit comprises an amplitude control loop and a phase control loop. The amplitude control loop adjusts the supply voltage to the power amplifier based upon the amplitude correction signal. The RF power amplifier system may reduce the corrective action of the amplitude loop during periods of relatively rapid changes in amplitude, and thus distortion can be further reduced.

21 Claims, 22 Drawing Sheets

U.S. PATENT DOCUMENTS

| | | | |
|---|---|---|---|
| 5,606,285 | A | 2/1997 | Wang et al. |
| 5,675,288 | A | 10/1997 | Peyrotte et al. |
| 5,732,334 | A | 3/1998 | Miyake |
| 5,815,531 | A * | 9/1998 | Dent ............................ 375/298 |
| 5,822,442 | A | 10/1998 | Agnew et al. |
| 5,880,633 | A | 3/1999 | Leizerovich et al. |
| 5,936,464 | A | 8/1999 | Grondahl |
| 5,973,556 | A | 10/1999 | Su |
| 6,002,300 | A | 12/1999 | Herbster et al. |
| 6,031,421 | A | 2/2000 | McEwan |
| 6,043,707 | A | 3/2000 | Budnik |
| 6,133,792 | A | 10/2000 | Hansson |
| 6,141,541 | A | 10/2000 | Midya et al. |
| 6,166,596 | A | 12/2000 | Higashiyama et al. |
| 6,166,598 | A | 12/2000 | Schlueter |
| 6,175,273 | B1 | 1/2001 | Sigmon et al. |
| 6,198,347 | B1 | 3/2001 | Sander et al. |
| 6,208,199 | B1 | 3/2001 | Andersson |
| 6,275,685 | B1 | 8/2001 | Wessel et al. |
| 6,295,442 | B1 | 9/2001 | Camp, Jr. et al. |
| RE37,407 | E | 10/2001 | Eisenberg et al. |
| 6,300,826 | B1 | 10/2001 | Mathe et al. |
| 6,353,359 | B1 | 3/2002 | Leizerovich |
| 6,377,784 | B2 | 4/2002 | McCune |
| 6,404,823 | B1 | 6/2002 | Grange et al. |
| 6,437,641 | B1 | 8/2002 | Bar-David |
| 6,438,360 | B1 * | 8/2002 | Alberth et al. ................ 455/110 |
| 6,445,249 | B1 | 9/2002 | Khan et al. |
| 6,449,465 | B1 | 9/2002 | Gailus et al. |
| 6,472,934 | B1 | 10/2002 | Pehike |
| 6,528,975 | B2 | 3/2003 | Sander |
| 6,539,072 | B1 | 3/2003 | Donnelly et al. |
| 6,583,664 | B2 | 6/2003 | Mathe et al. |
| 6,633,199 | B2 | 10/2003 | Nielsen et al. |
| 6,646,501 | B1 | 11/2003 | Wessel |
| 6,661,210 | B2 | 12/2003 | Kimball et al. |
| 6,734,724 | B1 * | 5/2004 | Schell et al. .................... 330/10 |
| 6,741,127 | B2 | 5/2004 | Sasho et al. |
| 6,781,452 | B2 | 8/2004 | Cioffi et al. |
| 6,825,726 | B2 | 11/2004 | French et al. |
| 6,917,244 | B2 | 7/2005 | Rosneil et al. |
| 6,924,695 | B2 | 8/2005 | Cioffi et al. |
| 6,924,700 | B2 | 8/2005 | Taura et al. |
| 6,924,711 | B2 | 8/2005 | Liu |
| 6,928,272 | B2 | 8/2005 | Doi |
| 6,968,163 | B2 | 11/2005 | Kuechler et al. |
| 7,058,373 | B2 | 6/2006 | Grigore |
| 7,068,743 | B1 | 6/2006 | Suzuki |
| 7,109,897 | B1 | 9/2006 | Levesque |
| 7,197,286 | B2 | 3/2007 | Ode et al. |
| 7,250,815 | B2 | 7/2007 | Taylor et al. |
| 7,359,685 | B2 | 4/2008 | Jafari et al. |
| 7,440,731 | B2 | 10/2008 | Staudinger et al. |
| 7,761,065 | B2 | 7/2010 | Drogi et al. |
| 2002/0053897 | A1 | 5/2002 | Kajiwara et al. |
| 2002/0137481 | A1 | 9/2002 | Chen et al. |
| 2002/0168949 | A1 | 11/2002 | Johannisson et al. |
| 2002/0175764 | A1 | 11/2002 | Matsuura et al. |
| 2003/0017840 | A1 | 1/2003 | Katagishi et al. |
| 2003/0155978 | A1 | 8/2003 | Pehlke |
| 2004/0071225 | A1 | 4/2004 | Suzuki et al. |
| 2004/0162039 | A1 | 8/2004 | Marque-Pucheu |
| 2004/0189378 | A1 | 9/2004 | Suzuki et al. |
| 2004/0198257 | A1 * | 10/2004 | Takano et al. ................ 455/108 |
| 2004/0263254 | A1 * | 12/2004 | Tahara et al. ................. 330/285 |
| 2005/0007083 | A1 | 1/2005 | Yang et al. |
| 2005/0046474 | A1 | 3/2005 | Matsumoto et al. |
| 2005/0059362 | A1 | 3/2005 | Kalajo et al. |
| 2005/0064830 | A1 | 3/2005 | Grigore |
| 2005/0122163 | A1 | 6/2005 | Chu |
| 2005/0156662 | A1 | 7/2005 | Raghupathy et al. |
| 2005/0242880 | A1 | 11/2005 | Domokos et al. |
| 2006/0001483 | A1 | 1/2006 | Cioffi et al. |
| 2006/0040625 | A1 | 2/2006 | Saito et al. |
| 2006/0232332 | A1 | 10/2006 | Braithwaite |
| 2006/0270366 | A1 | 11/2006 | Rozenblit et al. |
| 2007/0096806 | A1 | 5/2007 | Sorrells et al. |
| 2007/0184791 | A1 | 8/2007 | Vinayak et al. |
| 2007/0184792 | A1 | 8/2007 | Drogi et al. |
| 2007/0184793 | A1 | 8/2007 | Drogi et al. |
| 2007/0184794 | A1 | 8/2007 | Drogi et al. |
| 2007/0184796 | A1 | 8/2007 | Drogi et al. |
| 2007/0218848 | A1 | 9/2007 | Drogi et al. |
| 2007/0247253 | A1 * | 10/2007 | Carey et al. .................. 332/112 |

FOREIGN PATENT DOCUMENTS

| | | | |
|---|---|---|---|
| EP | 1225690 | A2 | 7/2002 |
| EP | 0812064 | B1 | 9/2003 |
| GB | 2389275 | A | 12/2003 |
| JP | 04-192907 | A | 7/1992 |
| JP | 06-164249 | A | 6/1994 |
| JP | 8-204774 | A | 8/1996 |
| JP | 2000-507751 | A | 6/2000 |
| JP | 3207153 | B2 | 7/2001 |
| JP | 2001-519612 | A | 10/2001 |
| JP | 2005-117315 | A | 4/2005 |
| WO | WO 95/34128 | A1 | 12/1995 |
| WO | WO 97/28598 | A1 | 8/1997 |
| WO | WO 99/18663 | A1 | 4/1999 |
| WO | WO 99/59243 | A1 | 11/1999 |
| WO | WO 00/16473 | A1 | 3/2000 |
| WO | WO 01/65685 | A1 | 9/2001 |
| WO | WO 2005/036739 | A1 | 4/2005 |
| WO | WO 2005/041438 | A1 | 5/2005 |
| WO | WO 2005/101678 | A2 | 10/2005 |

OTHER PUBLICATIONS

"Edge Modulation—How Linearization Improves Amplifier Performance"; Fergus, T.J.; RF Design, Oct. 2002, 7 pages.

"LF-2.7GHz RF/IF Gain and Phase Detector, AD8302"; Analog Devices, Inc. 2002; (online) Website: http://www.analog.com/UploadFile/Data_Sheets/797075782AD8302_a.pdf#search=AD8302.

McCune, Jr. EW.; "Direct Polar Modulation has the Right Stuff," CommsDesign, (online) Website: http://www.commsdesign.com/showarticle.jhtm?articleID=173500205, Nov. 7, 2000.

Morgan, P.; "Highly Integrated Transceiver Enables High-Volume Production of GDM/EDGE Handsets," Silicon Laboratories, Inc.; 2005, 6 pages; Apr. 5, 2006; Website: http://.silabscom/public/documents/marcom_doc/mcoll/Wireless/Aero_RF_Transceivers/en/Aerlle_Overview.pdf.

Raab, F. et al; "RF and Microwave Power Amplifier and Transmitter Technologies—Part 3,"; High Frequency Electronics; Sep. 2003; pp. 34-48.

Raab, F. et al; "RF and Microwave Power Amplifier and Transmitter Technologies—Part 4," High Frequency Electronics; Nov. 2003; pp. 38-49.

"SEQ5400—The World's First Single-Chip WEDGE Transceiver," Sequoia Communications; Apr. 5, 2006; (Online) Website: http://www.sequoia-communications.com/SEQ5400Data_Sheet.pdf.

Sowlati,T. et al.; "Polar Loop Transmitter,"; Skyworks; Apr. 5, 2006; (Online) Website: http://paworkshop.ucsd.edu/papers2004/S1_2Polar%20Loop%20Transmitter.ppt.

Wilkins, B. et al.; "Large Signal Polar Modulation Reduces Heat Dissipation and Increases Battery Life in EDGE Handsets"; Feb. 2005; Microwave Product Digest; (Online) Website: http://www.mpdigest.com/Articles/2005/feb2005/rfmd/Degault.htm.

"The Changing Face of Amplifier Design," Nujira, [online] [Retrieved on Apr. 5, 2006] Retrieved from the Internet<URL:http://www.nujira.com/technology/>.

Fergus, T.J., "EDGE Modulation—How Linearization Improves Amplifier Performance," RFDesign, Oct. 2002, 7 pages.

"LF-2.7 GHz RF/IF Gain and Phase Detector, AD8302," Analog Devices, Inc., 2002, [online] [Retrieved on Apr. 5, 2006] Retrieved from the Internet<URL:http://www.analog.com/UploadedFiles/Data_Sheets/797075782AD8302_a.pdf#search='AD83 02'>.

McCune, Jr., E.W., "Direct Polar Modulation has the Right Stuff," CommsDesign, Nov. 7, 2005, [online] [Retrieved on Apr. 5, 2006] Retrieved from the Internet<URL:http://www.commsdesign.com/showArticle.jhtm?articleID=173500205>.

Morgan, P., "Highly Integrated Transceiver Enables High-Volume Production of GSM/EDGE Handsets," Silicon Laboratories, Inc., 2005, 6 pages, [online] [Retrieved on Apr. 5, 2006] Retrieved from the Internet<URL:http://www.silabs.com/public/documents/marcom_doc/mcoll/Wireless/Aero_RF_Transceivers/en/Aerolle_Overview.pdf>.

PCT International Search Report and Written Opinion, PCT/US07/02389, Oct. 19, 2007, 10 Pages.

PCT International Search Report and Written Opinion, PCT/US07/61499, Nov. 6, 2007, 11 pages.

PCT International Search Report and Written Opinion, PCT/US07/61578, Oct. 11, 2007, 7 pages.

PCT International Search Report and Written Opinion, PCT/US07/02676, Nov. 6, 2007, 9 pages.

Raab, F. et al., "RF and Microwave Power Amplifier and Transmitter Technologies—Part 3," High Frequency Electronics, Sep. 2003, pp. 34-48.

Raab, F. et al., "RF and Microwave Power Amplifier and Transmitter Technologies—Part 4," High Frequency Electronics, Nov. 2003, pp. 38-49.

"SEQ5400—The World's First Single-Chip WEDGE Transceiver," Sequoia Communications, [online] [Retrieved on Apr. 5, 2006] Retrieved from the Internet<URL:http:www.sequoia-communications.com/SEQ5400Data_Sheet.pdf>.

Sowlati, T. et al., "Polar Loop Transmitter," Skyworks™, [online] [Retrieved on Apr. 5, 2006] Retrieved from the Internet<URL:http://paworkshop.ucsd.edu/papers2004/S1_2Polar%20Loop%20Transmitter.ppt>.

Wilkins, B. et al., "Large Signal Polar Modulation Reduces Heat Dissipation and Increases Battery Life in EDGE Handsets" Feb. 2005, Microwave Product Digest, [online] [Retrieved on Apr. 5, 2006] Retrieved from the Internet<URL:http:www.mpdigest.com/Articles/2005/feb2005/rfmd/Default.htm>.

United States Office Action, U.S. Appl. No. 11/429,119, Oct. 29, 2009, 25 pages.

U.S. Office Action, U.S. Appl. No. 11/623,030, Sep. 1, 2009, 7 pages.

U.S. Office Action, U.S. Appl. No. 11/669,648, Aug. 6, 2009, 11 pages.

U.S. Office Action, U.S. Appl. No. 11/621,522, Oct. 5, 2009, 5 pages.

European Extended Search Report, European Application No. 07763471.5, Jun. 9, 2010, 11 pages.

United States Office Action, U.S. Appl. No. 11/671,423, Jun. 21, 2010, 7 pages.

United States Office Action, U.S. Appl. No. 11/429,119, Sep. 17, 2010, 27 pages.

United States Office Action, U.S. Appl. No. 11/621,522, Apr. 21, 2010, 16 pages.

United States Office Action, U.S. Appl. No. 11/670,931, Apr. 28, 2010, 20 pages.

Japanese Office Action, Japanese Application No. 2008-553333, Oct. 1, 2010, 5 pages.

Japanese Office Action, Japanese Application No. 2008-553289, Sep. 30, 2010, 5 pages.

Japanese Office Action, Japanese Application No. 2008-553347, Oct. 1, 2010, 6 pages.

United States Office Action, U.S. Appl. No. 12/815,209, Oct. 19, 2010, 6 pages.

United States Office Action, U.S. Appl. No. 12/761,258, Aug. 5, 2010, 6 pages.

United States Office Action, U.S. Appl. No. 11/669,648, Aug. 5, 2010, 7 pages.

Cardinal, J-S. et al., "A New Adaptive Double Envelope Feedback (ADEF) Linearizer for Solid State Power Amplifiers," IEEE Transactions on Microwave Theory and Techniques, Jul. 1995, pp. 1508-1515, vol. 43, No. 7.

Park, H-M. et al., "A New Predistortion Linearizer Using Envelope-Feedback Technique for PCS High Power Amplifier Application," Proceedings of the IEEE Radio and Wireless Conference (RAWCON), Aug. 1999, pp. 223-226.

Park, H-M. et al., "A Predistortion Linearizer Using Envelope-Feedback Technique with Simplified Carrier Cancellation Scheme for Class-A and Class-AB Power Amplifiers," IEEE Transactions on Microwave Theory and Techniques, Jun. 2000, pp. 898-904, vol. 48, No. 6.

United States Office Action, U.S. Appl. No. 11/670,931, Jan. 7, 2011, 14 pages.

United States Office Action, U.S. Appl. No. 11/621,522, Jun. 9, 2011, 19 pages.

Woo, W. et al., "A New Envelope Predistortion Linearization Architecture for Handset Power Amplifiers," Proceedings of the IEEE Radio and Wireless Conference (RAWCON) 2004, Sep. 2004, pp. 175-178.

Korean Office Action, Korean Application No. 10-2008-7020806, Nov. 29, 2010, 21 pages.

United States Office Action, U.S. Appl. No. 11/621,522, Dec. 6, 2010, 23 pages.

United States Office Action, U.S. Appl. No. 13/034,587, Jun. 30, 2011, 12 pages.

* cited by examiner

US 8,032,097 B2

AMPLITUDE ERROR DE-GLITCHING CIRCUIT AND METHOD OF OPERATING

CROSS-REFERENCE TO RELATED APPLICATION

This application claims priority under 35 U.S.C. §119(e) from co-pending U.S. Provisional Patent Application No. 60/764,947, entitled "RF, Power Amplifier with Efficiency Improvement for High Peak to Average Modulation Types," filed on Feb. 3, 2006; and this application is a continuation-in-part application of, and claims the benefit under 35 U.S.C. §120 from co-pending U.S. patent application Ser. No. 11/429,119 entitled "Power Amplifier Control Circuit," filed on May 4, 2006, the subject matter of both of which is incorporated by reference herein in its entirety.

BACKGROUND

1. Field of the Invention

The present invention relates to a circuit for controlling RF PAs (Radio Frequency Power Amplifiers), and more specifically, to an RF PA controller circuit that controls the supply voltage of a PA using a closed amplitude control loop with an amplitude correction signal.

2. Description of the Related Art

RF (Radio Frequency) transmitters and RE power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life on these portable electronic devices. For example, cellular telephone makers make great efforts to increase the efficiency of the RF PA circuits, because the efficiency of the RF PAs is one of the most critical factors determining the battery life of the cellular telephone and its talk time.

FIG. 1 illustrates a conventional RF transmitter circuit, including a transmitter integrated circuit (TXIC) 102 and an external power amplifier (PA) 104. For example, the RF transmitter circuit may be included in a cellular telephone device using one or more cellular telephone standards (modulation techniques) such as UMTS (Universal Mobile Telephony System) or CDMA (Code Division Multiple Access), although the RF transmitter circuit may be included in any other type of RF, electronic device. For purposes of illustration only, the RF transmitter circuit will be described herein as a part of a cellular telephone device. The TXIC 102 generates the RF signal 106 to be amplified by the PA 104 and transmitted 110 remotely by an antenna (not shown). For example, the RF signal 106 may be an RF signal 106 modulated by the TXIC 102 according to the UMTS or CDMA standard.

The RF power amplifier in general includes an output transistor (not shown) for its last amplification stage. When an RF modulated signal is amplified by the RF PA 104, the output transistor tends to distort the RF modulated signal 106, resulting in a wider spectral occupancy at the output signal 110 than at the input signal 106. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak of the amplitude of the RF input signal 106, as the biasing remains fixed for the acceptable distortion at the peak power level.

Certain RF modulation techniques have evolved to require even more spectral efficiency, and thereby forcing the RF PA 104 to sacrifice more efficiency. For instance, while the efficiency at peak power of an output transistor of the PA 104 can be above 60%, when a modulation format such as WCDMA is used, with certain types of coding, the efficiency of the RF PA 104 falls to below 30%. This change in performance is due to the fact that the RF transistor(s) in the RF PA 104 is maintained at an almost fixed bias during the off-peak of the amplitude of the RF input signal 106.

Certain conventional techniques exist to provide efficiency gains in the RF PA 104, One conventional technique is EER (Envelope Elimination and Restoration). The EER technique applies the amplitude signal (not shown in FIG. 1) and the phase signal (not shown in FIG. 1) of the RF input signal 106 separately to 2 ports of the power amplifier 104, i.e., its supply voltage port (Vcc) 108 and its RF input port 107, respectively. However, the EER technique often fails to provide significant efficiency gains, because the supply voltage 108 cannot be varied in an energy-efficient way to accommodate the large variations in the amplitude signal of the RF input signal 106 and thus it fails to provide a substantial energy efficiency gain while maintaining the required linear amplification of the RF signal 106 in the RF PA 104. This is mainly due to the difficulty in realizing a fast, accurate, wide range, and energy efficient voltage converter to drive the supply voltage of the RF PA 104.

The conventional EER technique can function better only if a variable power supply with a very large variation range is used to adjust the supply voltage based on the amplitude signal of the RF input signal 106, while not reducing the efficiency of the RF transmitter by power consumed by the power supply itself. However, the variable power supply, which is typically comprised of a linear regulator (not shown in FIG. 1) that varies its output voltage on a fixed current load such as the PA in linear mode, by principle reduces the supply voltage at constant current and by itself consumes the power resulting from its current multiplied by the voltage drop across the linear regulator when there is a large drop in the amplitude signal of the RF input signal 106. This results in no change in the overall battery power being consumed by the RF transmitter, because any efficiency gained in the RF PA 104 is mostly lost in the linear regulator itself. Variations of the EER technique, such as Envelope Following and other various types of polar modulation methods, likewise fails to result in any significant gain in efficiency in the RF transmitter, because the supply voltage is likewise adjusted based on the amplitude signal of the RF input signal 106 which inherently has large variations and thus has the same deficiencies as described above with respect to conventional EER techniques.

Quite often, the conventional methods of controlling a PA 104 fail to address the amplitude-to-phase re-modulation (AM-to-PM) which occurs in a non-frequency linear device such as a PA. Thus, the conventional methods are not suitable for the common types of PAs for use in common mobile telephony or mobile data systems because the required spectral occupancy performance is compromised by the AM to PM distortion.

Finally, PAs are typically used in conjunction with band pass filters that have a high electric coefficient of quality. These filters are typically of the SAW (surface acoustic wave)

type. Due to their high coefficient of quality, the filters exhibit a relatively high group delay. The group delay makes it very difficult for a correction loop to work around the arrangement of the SAW filter and the PA while still meeting the high bandwidth requirements needed for the correction of the AM-to-PM.

Thus, there is a need for an RF PA system that is efficient over a wide variety of modulation techniques and results in a significant net decrease in power consumption by the RF PA circuit. There is also a need for a PA controller that can correct the AM to PM effects, while not relying on a PA specially designed for low AM to PM at the expense of efficiency. In addition, there is a need for a PA controller that can exclude the use of SAW filters from the path of the correction loop in the PA circuitry.

SUMMARY

One embodiment of the present invention disclosed is a power amplifier controller circuit for controlling a power amplifier based upon an amplitude correction signal or amplitude error signal. The power amplifier receives and amplifies an input signal to the power amplifier and generates an output signal, and the power amplifier controller circuit controls the power amplifier so that it operates in an efficient manner.

The PA controller circuit comprises an amplitude control loop and a phase control loop. The amplitude control loop determines the amplitude correction signal (also referred to herein as the amplitude error signal), which is indicative of the amplitude difference between the amplitude of the input signal and the attenuated amplitude of the output signal, and adjusts the supply voltage to the power amplifier based upon the amplitude correction signal. The phase control loop determines a phase error signal, which indicates a phase difference between phases of the input signal and the output signal, and adjusts the phase of the input signal based upon the phase error signal to match the phase of the output signal. Thus, the phase control loop corrects for unwanted phase modulation introduced by the AM to PM non-ideality of the power amplifier and thus reduces phase distortion generated by the power amplifier.

In a first embodiment of the present invention, the amplitude control loop comprises an amplitude comparator comparing the amplitude of the input signal with an attenuated amplitude of the output signal to generate an amplitude correction signal, and a power supply coupled to receive the amplitude correction signal and generating the adjusted supply voltage provided to the power amplifier based upon the amplitude correction signal. The power supply can be a switched mode power supply. By using the amplitude correction signal to control the supply voltage to the power amplifier, a high efficiency yet low-bandwidth power supply such as the switched mode power supply may be used to provide the adjusted supply voltage to the power amplifier.

In a second embodiment of the present invention, the amplitude correction signal is split into two or more signals with different frequency ranges and provided respectively to different types of power supplies with different levels of efficiency to generate the adjusted supply voltage provided to the power amplifier. For example, in the second embodiment, the power supplies include a first power supply with a first efficiency and a second power supply with a second efficiency higher than the first efficiency. The first power supply receives a first portion of the amplitude correction signal in a first frequency range and generates a first adjusted supply output based upon the first portion of the amplitude correction signal, and the second power supply receives a second portion of the amplitude correction signal in a second frequency range lower than the first frequency range and generates a second adjusted supply output based upon the second portion of the amplitude correction signal. The first and second adjusted supply outputs are combined to form the adjusted supply voltage provided to the power amplifier. The first power supply can be a linear regulator, and the second power supply can be a switched mode power supply. By dividing the amplitude correction signal into two or more signals with different frequency ranges, the second embodiment of the present invention has the additional advantage that the switched mode power supply may be implemented with even narrower bandwidth as compared to the first embodiment without significantly sacrificing efficiency. A narrower bandwidth power supply or a variable power supply with a smaller range of voltage variation is easier to implement.

In a third embodiment of the present invention, the amplitude control loop further comprises a gain control module receiving the amplitude correction signal to generate a gain control signal, and a variable gain amplifier adjusting the amplitude of the input signal according to the gain control signal. The third embodiment has the advantage that it is possible to operate the power amplifier at any given depth beyond its compression point, resulting in an extra degree of freedom in designing the PA circuit. This is useful in optimizing the efficiency gain versus spectral occupancy performance. By adding the variable gain amplifier, the amplitude of variation of the Vcc or bias voltage to the PA is further reduced, resulting in further significant efficiency gains.

In a fourth embodiment of the present invention, the amplitude loop operates in a manner which reduces the loop corrective action during periods of relatively rapid amplitude change in the signal amplified by the PA. These periods of relatively rapid amplitude change may be associated with certain types of transitions in the modulation, in which the signal modulation passes through or near the constellation origin. A relative decrease in amplitude of the signal can indicate this type of transition in the modulation.

The PA output amplitude lags the input amplitude due to the inherent delay through the PA. During the period when the signal amplitude is changing very rapidly, a temporary peaking of the difference in amplitude between input and output may result due to this lag. Since the amplitude loop described in prior embodiments generates an amplitude correction signal based on the difference between the amplitudes of the input and output, the amplitude correction signal may erroneously adjust the supply voltage to the PA or the gain of the VGA (if present) during these periods, adding distortion to the output signal.

Thus, in this embodiment, by reducing the corrective action of the loop during periods associated with periods of relatively rapid changes in amplitude, the distortion just described can be reduced.

BRIEF DESCRIPTION OF THE DRAWINGS

The teachings of the present invention can be readily understood by considering the following detailed description in conjunction with the accompanying drawings.

DETAILED DESCRIPTION

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
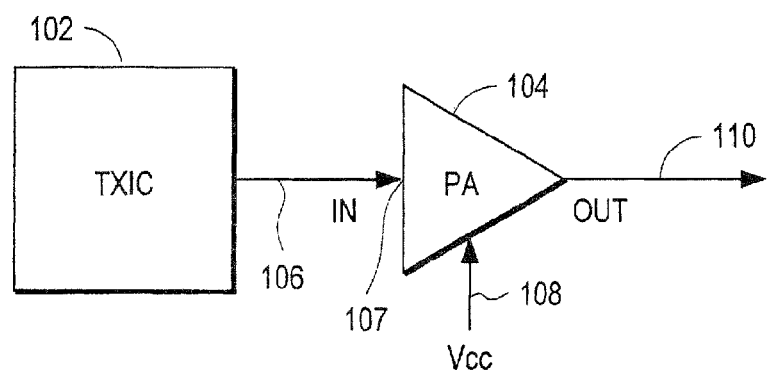
FIG. 1 illustrates a conventional RF transmitter circuit.
Figure 2:
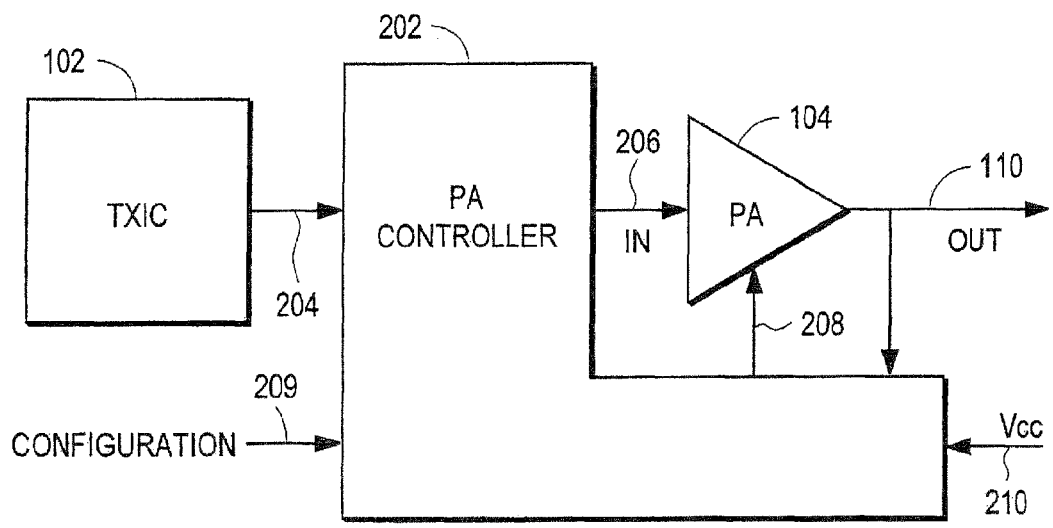
FIG. 2 illustrates an RF transmitter circuit including the PA controller in accordance with the present invention.

FIG. 2 illustrates an RF transmitter circuit including the PA controller 202 in accordance with the present invention. The PA controller 202 is placed between the transmitter IC 102 and the PA 104 to receive the RF signal 204 from the TXIC 102 and provide the RF signal 206 to the PA 104, while controlling the PA 104 by way of an adjusted supply voltage 208. The PA controller 202 is also placed between the power supply line (Vcc) 210 and the PA 104. The PA 104 amplifies the RF signal 206 to output the amplified RF output signal 110, which is also provided as a feedback signal back to the PA controller 202. As will be explained below with reference to FIGS. 3A, 3B, 4A, 4B, 5A, and 5B, the adjusted supply voltage 208 is generated by the PA controller 202 based on an amplitude correction signal (not shown in FIG. 2) indicative of the difference between the attenuated amplitude of the feedback RF output signal 110 and the amplitude of the RF input signal 204. Note that the term "amplitude correction signal" is used herein synonymously with the term "amplitude error signal." The PA controller 202 adjusts the supply voltage (Vcc) 210 based upon the amplitude correction signal to generate the adjusted supply voltage 208 provided to the PA 104, to optimize the efficiency of the PA 104. An advantage of the PA controller 202 is that existing signal connections to the PA 104 and the TXIC 102 need not change when the PA controller 202 is inserted between the TXIC 102, the PA 104, and the supply voltage (Vcc) 210.

The PA controller circuit 202 may also adjust the phase and amplitude of the signal 204 to allow for power control and PA 104 ramping, in accordance with information received through the configuration signals 209. Since the PA 104 controller circuit 202 is aware of the voltage at the output and the current in the power amplifier 104, it can also adjust for load variations at an antenna (not shown herein) that may be used with the PA. If a directional coupler (not shown) is used to feed the attenuated amplitude of the signal 204, the PA controller 202 can adjust the forward power while controlling the PA operation point as it is aware of the voltage and current at node 208.

Figure 3A:
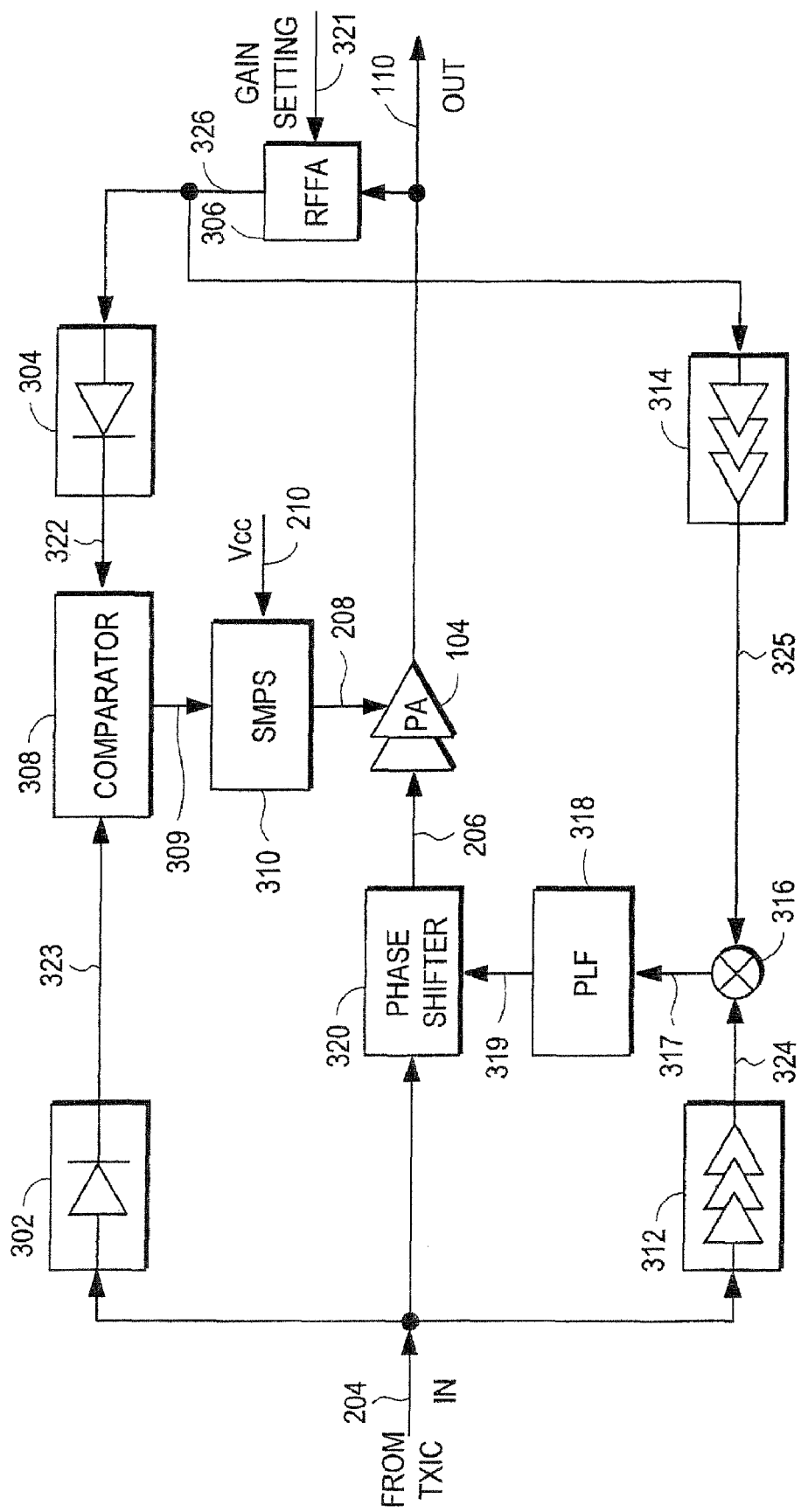
FIG. 3A illustrates an RF power amplifier system, in accordance with a first embodiment of the present invention.

FIG. 3A illustrates an RF PA system, according to a first embodiment of the present invention. The RF PA system includes the PA 104, and the PA controller 202 including a closed amplitude control loop and a closed phase control loop.

The phase control loop includes two limiters 312, 314, a phase comparator 316, a loop filter (PLF (Phase Loop Filter)) 318, and a phase shifter 320. To achieve stability over all conditions, the phase comparator 316 is of an adequate type with a capture range greater than 2*PI. To achieve this, a combination of adjustable delay elements and frequency dividers may be used. Also a phase sub-ranging system can be used since the dynamic phase variations that the phase correction loop processes are limited in amplitude. A sub-ranging phase control block (not shown) could be one of the constituents of the phase comparator 316 used with this system. Advantages of using sub-ranging in the phase comparator 316 are stability and good noise.

The amplitude control loop includes an adjusted variable attenuator (RFFA (RF Feedback Attenuator)) 306, two matched amplitude detectors 302, 304, a comparator 308, and a switched mode power supply (SMPS) 310. Note that the limiter 312 and the detector 302, and the limiter 314 and the detector 304, can be combined into a single limiter/power detector blocks without altering the functionality of the system.

Referring to FIG. 3A, the phase control loop monitors the RF input signal 204 from the transmitter IC 102 (not shown in FIG. 3A) and compares the phase of the RF input signal 204 with the phase of the output signal 110 of the PA 104 attenuated 326 by the adjusted variable attenuator (RFFA) 306, resulting in a control signal 319 that varies the phase of the RF signal 206 coming out of the phase shifter 320. More specifically, the limiter 312 receives the RF input signal 204 from the TXIC 102 and outputs to the comparator 316 an amplitude limited signal 324 mathematically representative of the phase of its input signal. The limiter 314 also receives the output signal 110 of the PA 104 as attenuated 326 by the adjusted variable attenuator (RFFA) 306, and outputs its phase signal 325 to the comparator 316. The comparator 316 compares the phases of the output signals 324, 325 of the two limiters 312, 314, and generates a phase error signal 317. Note that the term "phase error signal" is used herein synonymously with the term "phase correction signal." The phase error signal 317 is filtered by the loop filter (PLF) 318 to generate the phase control signal 319. The loop filter 318 completes the phase loop and provides the necessary gain, bandwidth limitation, and loop stability required for the phase loop to function properly. The particular loop filter used here can be of any type, and can include multiple integration and derivation stages so as to satisfy the best loop performance. The types of the loop filter may include classical types I, II, and the like. A particularity of this phase loop design is that the group delay through the PA 104 must be taken into account for stability reasons. This is achieved by choosing the proper pole-zero placement in the loop filter and may include delay compensation. The phase control signal 319 is input to the phase shifter 320 to control the shifting of the phase of the input RF signal 206 so that the phase of the output signal 110 dynamically matches the phase of the transmitter signal 204.

The function of the phase control loop is to counteract the AM (Amplitude Modulation) to PM (Phase Modulation) characteristics of the PA 104, which is part of the normal distortion characteristics of transistor-based amplifiers, allowing for the phase of the RF signal to be held constant at the output 110 of the PA 104 compared with the input 204 of the phase shifter 320 and thus reducing phase distortion generated by the PA 104. This phase control loop contributes to linearizing the PA 104 as the AM to PM phase shift of the PA 104 tends to become higher at higher power levels. By limiting the effects of AM to PM of the PA 104, the phase control loop allows the PA 104 to function at higher power levels with less distortion for the output signal 110, thus allowing the use of the PA 104 in more favorable efficiency conditions. In addition, the phase control loop also helps in correcting any additional AM to PM characteristics that the amplitude control loop (described below) may cause. While FIG. 3A shows the phase shifter circuit 320 controlling the input to the PA 104, it is also possible to place the phase shifter 320 at the output of the PA 104 with the same benefits.

Note that the phase control loop is of the error correction only type. In other words, the phase control loop does not modify the phase of the input signal 204 to the PA 104 unless the PA 104 or the amplitude control loop introduces a phase error. Since the noise contributions of the feedback loops affect the overall signal quality of the RF transmitter, an error correction only loop such as the phase control loop shown in FIG. 3A by definition introduces only a small correction, hence has a low noise contribution.

The amplitude control loop is also of the error correction only type, and thus is referred to herein as the amplitude correction loop. Thus, amplitude control loop and amplitude correction loop are used synonymously herein. Referring to FIG. 3A, the amplitude of the RF input signal 204 is monitored through the amplitude detector 302 and compared by the comparator 308 with the amplitude at the output 10 of the PA 104 as attenuated 326 by the adjusted variable attenuator (RFFA) 306, seen through a matched amplitude detector 304. The attenuator 306 is adjusted such that the output 110 of the PA 104 is at a desired level. This can be achieved though programming 321 the variable attenuator (RFFA) 306 by either a digital input to the PA 104 controller 202 or by analog control of the variable attenuator (RFFA) 306. The comparator 308 generates an error signal 309 indicating the difference between the amplitude of the input RF signal 204 and the attenuated amplitude 326 of the output RF signal 110, referred to herein as the "amplitude correction signal" 309. The amplitude correction signal 309 is fed into power supply 310, which is a switch mode power supply (SMPS). The SMPS 310 generates an adjusted supply voltage 208 provided to one or more supply voltage pins of the PA 104 based upon the amplitude correction signal 309. The adjusted supply voltage 208 in essence operates as a bias control signal that controls the operating point of the PA 104.

For a given output power, adjusting the supply voltage 208 of the PA 104 has the effect of varying its gain, as well as changing its efficiency. For a given output power, lowering the supply voltage 208 to the PA 104 provides better efficiency for the PA 104. The adjusted supply voltage 208 of the PA 104 is adjusted to ensure that the PA 104 stays in its most efficient amplification zone. Because adjusting the supply voltage 208 of the PA 104 does make a change to the gain of the PA 104, the output amplitude of the PA 104 changes with the supply voltage 208 from the SMPS 310, and the amplitude control loop can be closed. The principles of such operation can be explained as follows.

When the input to the PA 104 increases, the output of the PA 104 also increases. As the PA 104 stays in its linear region of operation, which corresponds to small input signals, its output will increase linearly with its input. Thus, both inputs to the comparator 308 will rise by the same amount, resulting in no error correction and no change to the supply voltage 208. This is the case when the output power is relatively small and well below the saturation point.

As the input power continues to rise at the input of PA 104, there will be a point beyond which the output of the PA 104 will no longer be directly proportional with the input to the PA 104. The amplitude control loop will detect this error between the output and input of the PA 104, and raise the supply voltage to the PA 104 such that the initially-desired output power is delivered, resulting in linear operation of the system, even with a non-linear PA 104.

Figure 7:
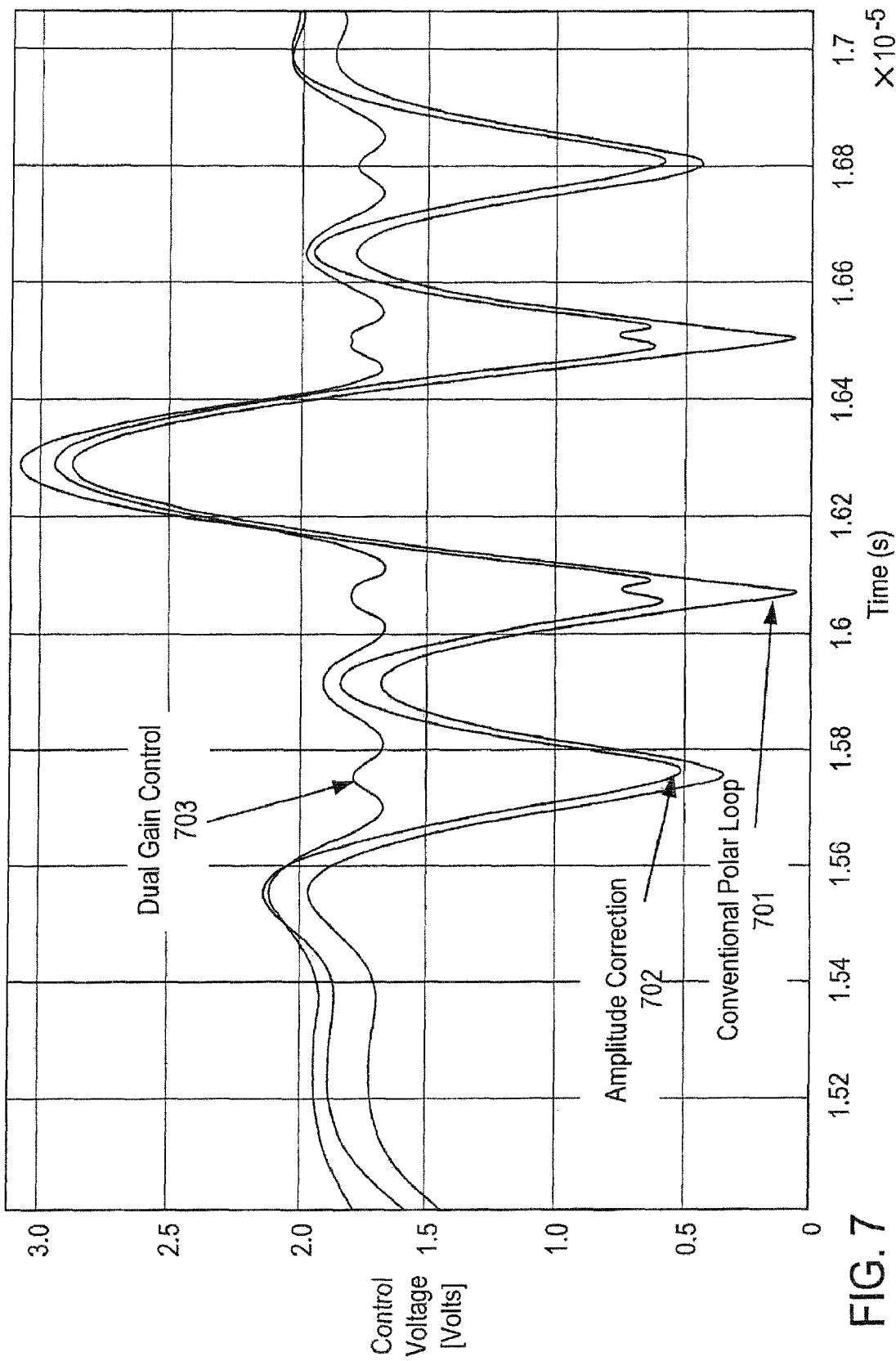
FIG. 7 illustrates simulation results of the changes in the waveform of the supply voltage 208 to the PA corresponding to the conventional polar control method, the first embodiment of FIG. 3A, and the third embodiment of FIG. 5A, for a typical commercial WCDMA PA with 3.4 V nominal supply voltage and WCDMA modulation using 3.84 Mchips per second.

In a practical application, the PA 104 will be fully or partially saturated from its Vcc, for example, the highest 10 dB of its output power range, and as the RF modulation of the RF signal 204 forces the amplitude to vary, the amplitude control loop will only be actively controlling the supply voltage 208 to the PA 104 when the highest powers are required. For lower input power, the amplitude control loop will leave the supply voltage 208 at a fixed level because it detects no gain error, resulting in a fixed gain for the PA 104. The depth beyond compression can be adjusted by setting the level of the input signal 204 and the level of the attenuator 306, as well as the default supply voltage Vcc (not shown in FIG. 3A) to the PA 104. This behavior is illustrated in FIG. 7 where simulation results compare the behavior of the conventional polar architecture (with no feedback) where the supply voltage to the PA swings between 0.1 V and 2.9 V and reaches a minimum value around 0.1 V as shown with curve 701, while the supply voltage 208 to the PA 104 in the first embodiment of FIG. 3A using the amplitude correction signal 309 does not drop below 0.5 V as shown with curve labeled 702. The amplitude swing in the dual gain control method is clearly further reduced as indicated by curve 703, as will be explained in detail below with respect to the third embodiment of the present invention with reference to FIGS. 5A and 5B.

Varying the supply voltage to the PA 104 also results in a phase change. Thus, the phase control loop described above operates in conjunction with the amplitude control loop to maintain the accuracy of RF modulation at the output signal of the PA 104. Note that the phase control loop is also an error correction loop only, and therefore minimally contributes to noise.

Furthermore, the amplitude correction loop has the advantage that an SMPS 310, which does not consume any significant power by itself and thus actually increases the efficiency of the overall RF power amplifier system, can be used to generate the adjusted supply voltage 208 to the PA 104. This is possible because the adjusted supply voltage 208 to the PA 104 is generated by the SMPS 310 based upon the amplitude correction signal 309 which by nature has a much narrower range of variation or fluctuation rather than the actual amplitude of the RF input signal 204 which by nature has a much wider range of variation or fluctuation. An SMPS 310 is easier to implement to follow the amplitude correction signal 309 with a narrow range of variation, but would be more difficult to implement if it had to follow the unmodified amplitude of the RF input signal 204. This is related to the fact that the amplitude signal itself has its fastest variations when the amplitude itself is low. The amplitude correction loop does not need to make any changes to its output when the PA is operating in linear mode. For example, the amplitude correction signal 309 may be only active for the highest 10 dB of the actual output power variation. In contrast, the amplitude signal itself may vary by 40 dB, and varies much faster between −10 dBc to −40 dBc than it does between 0 dBc to −10 dBc. Thus the bandwidth requirements on the SMPS 310, which are coupled with the rate of change of the voltage, are reduced when an amplitude correction signal 309 rather than the amplitude signal itself is used to control the supply of the PA 104. The SMPS 310 does not consume any significant power by itself, and thus does not significantly contribute to usage of the battery power, and actually increases the efficiency of the RF power amplifier system. In contrast, a conventional polar modulation technique typically utilizes the amplitude signal itself to adjust the supply voltage to the PA 104, which prevents the use of an SMPS 310 for wideband RF signals because of the higher bandwidth requirements. Therefore, conventional RF power amplifier control systems typically use linear regulators (rather than an SMPS) to adjust the supply voltage to the PA 104. Such a linear regulator by itself consumes power resulting from its current multiplied by the voltage drop across the linear regulator. When there is a large drop in the amplitude signal, this can result in significant power being lost and results in none or little reduction in the overall battery power being consumed by the RF transmitter. This is because any efficiency gained in the RF PA is mostly lost in the linear regulator itself.

Figure 3B:
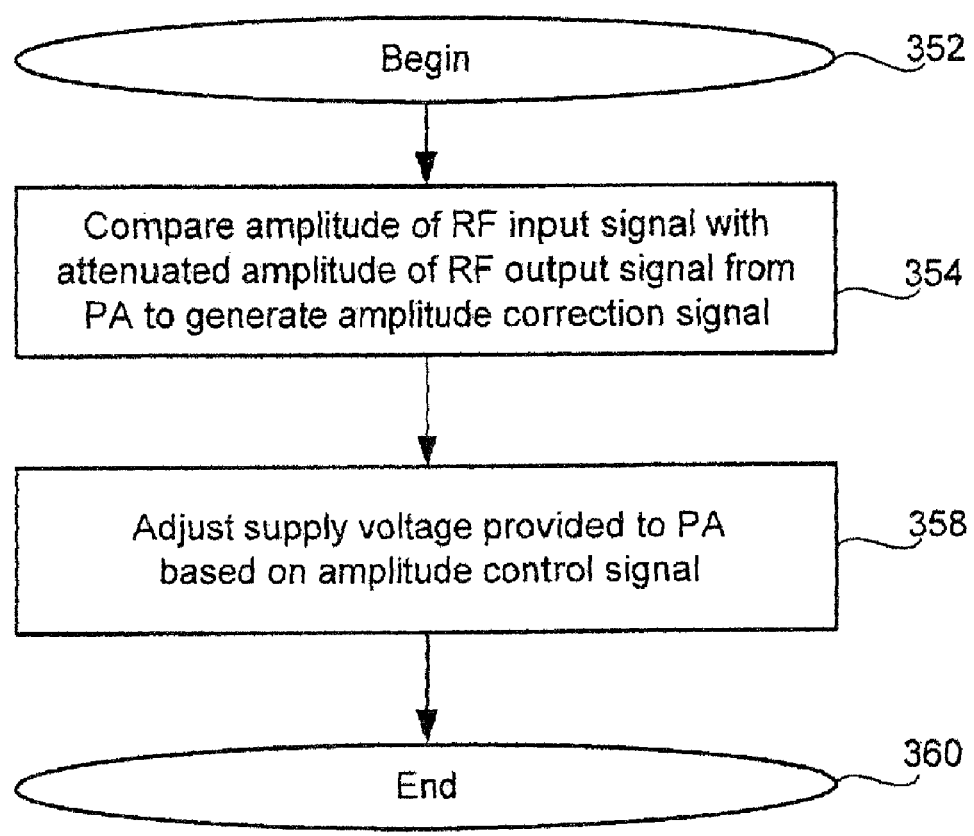
FIG. 3B illustrates a method of controlling the amplitude control loop of a RF PA system, in accordance with the first embodiment of the present invention.

FIG. 3B illustrates a method of controlling the amplitude control loop of a RF PA 104 in an RF PA system, according to the first embodiment of the present invention. Referring to both FIGS. 3A and 3B, as the process begins 352, the comparator 308 compares 354 the amplitude 323 of the RF input signal 204 with the attenuated amplitude 322 of the RF output signal 110 from the PA 104 to generate an amplitude correction signal 309. The SMPS 310 generates 358 an adjusted supply voltage 208 provided to the PA 104 based upon the amplitude correction signal 309, and the process ends. 360.

Figure 4A:
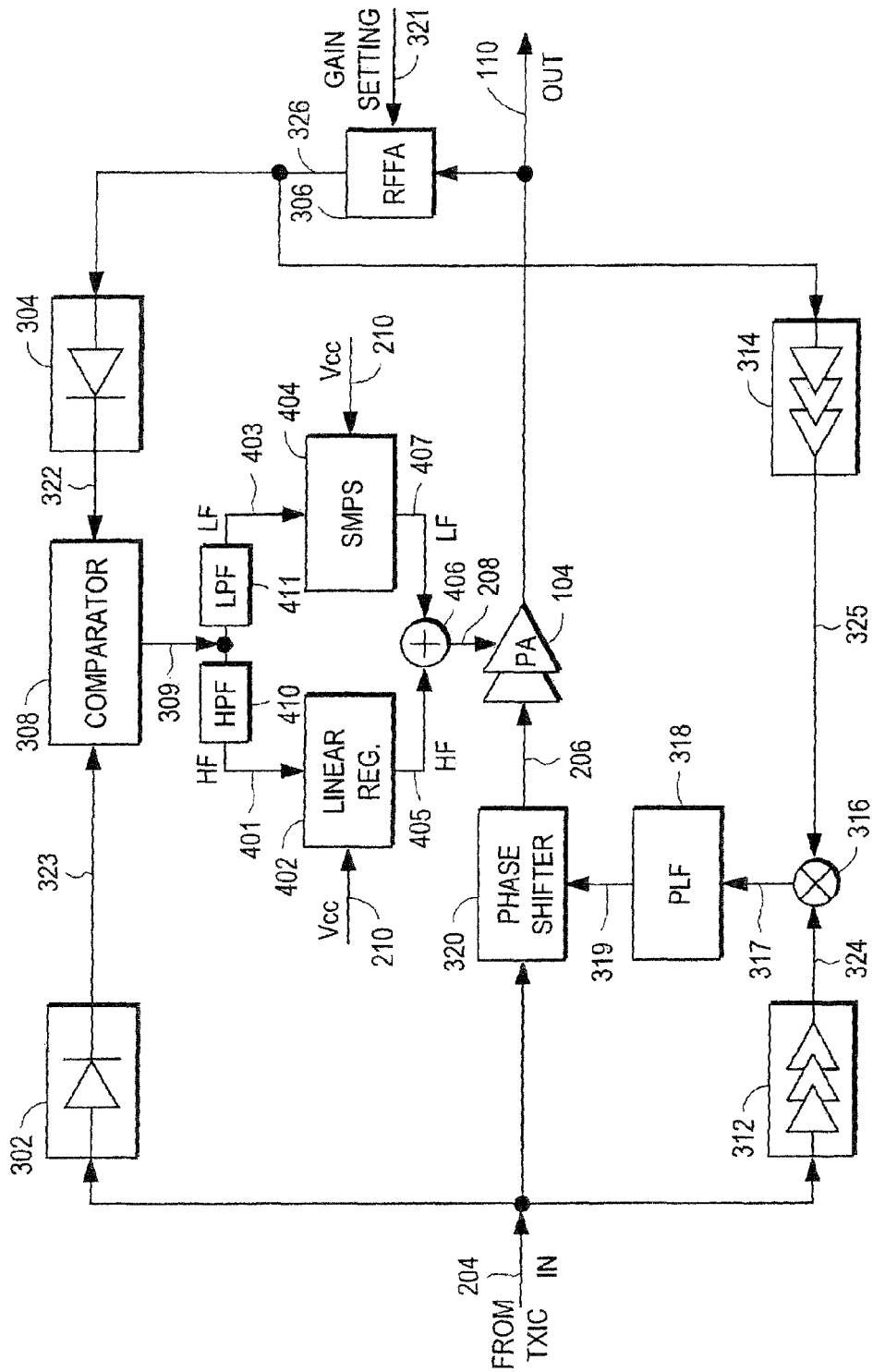
FIG. 4A illustrates an RF power amplifier system, in accordance with a second embodiment of the present invention.

FIG. 4A illustrates an RF PA system, according to a second embodiment of the present invention. The RF PA system illustrated in FIG. 4A is substantially the same as the RF transmitter circuit illustrated in FIG. 3A, except that (i) the amplitude correction signal 309 is split into two signals, a high frequency amplitude correction signal 401 that is fed into a high frequency path including a linear regulator 402 and a low frequency amplitude correction signal 403 that is fed into a low frequency path including an SMPS 404 and that (ii) the outputs of the linear regulator 402 and the SMPS 404 are combined in the adder block 406 to generate the adjusted supply voltage 208 to the PA 104. For example, a simple current adding node, a small, high frequency transformer or other types of active electronic solutions can be used as the adder block 406. Any other types of power combiner circuits may be used as the adder block 406.

The high frequency amplitude correction signal 401 is input to the linear regulator 402, which generates the high frequency part 405 of the adjusted supply voltage 208. The low frequency amplitude correction signal 403 is input to the SMPS 404, which generates the low frequency part 407 of the adjusted supply voltage 208. The adder block 406 combines the high frequency part 405 and the low frequency part 407 to generate the adjusted supply voltage 208 to the PA 104 in order to keep the PA 104 in an efficient operation range.

The amplitude correction signal 309 is split into the high frequency amplitude correction signal 401 and the low frequency amplitude correction signal 403 using the high pass filter 410 and the low pass filter 411, respectively. The high frequency amplitude correction signal 401 comprised of components of the amplitude correction signal 309 higher than a predetermined frequency and the low frequency amplitude correction signal 403 is comprised of components of the amplitude correction signal 309 lower than the predetermined frequency. The predetermined frequency used to split the amplitude correction signal 309 can be set at any frequency, but is preferably set at an optimum point where the efficiency of the overall RF transmitter system becomes sufficiently improved. For example, the predetermined frequency can be as low as $1/20^{th}$ of the spectrally occupied bandwidth for the RF signal. In other embodiments, the predetermined frequency may not be fixed but may be adjusted dynamically to achieve optimum performance of the RF transmitter system.

Power consumed by the linear regulator 401 from a power source such as a battery (not shown) for a given control voltage 208 on the PA 104 can be approximated as follows:

$$P_{bat} \approx I_{pa} \times V_{pa} + Eff1 \times (Vcc - V_{pa}) \times I_{pa}$$
$$\approx Eff1 \times Vcc \times I_{pa}$$

with Eff1=1.05, which is sufficiently close to 1 to allow for this approximation, where $P_{bat}$ is the power from the battery, $I_{pa}$ is the input current to the PA 104, $V_{pa}$ is the input supply voltage to the PA 104, and Vcc is the supply voltage of the battery. In addition, power consumed by the SMPS 404 from a power source such as a battery (not shown) for a given control voltage 208 on the PA 104 can be approximated as follows:

$$P_{bat} = Effs * I_{pa} * V_{pa}$$

with Effs=1.1,
and the efficiency of the switch (not shown) in the SMPS generally exceeding 90%.

If the average input voltage $V_{pa}$ to the PA 104 is significantly lower than supply voltage Vcc of the battery, the SMPS 404 achieves much lower power consumption. While the linear regulator 402 is generally less efficient than the SMPS 404, the linear regulator 402 processing the high frequency part 401 of the amplitude correction signal 309 does not male the overall RF PA 104 system inefficient in any significant way, because most of the energy of the amplitude correction signal 309 is contained in the low frequency part 403 rather than the high frequency part 401. This is explained below with reference to FIGS. 8 and 9.

Using both a high efficiency path comprised of the SMPS 404 carrying the low frequency portion 403 of the amplitude correction signal 309 and a low efficiency path comprised of the linear regulator 402 carrying the high frequency portion 401 of the amplitude correction signal 309 has the advantage that it is possible to use an SMPS 404 with a limited frequency response. In other words, the SMPS 404 need not accommodate for very high frequencies but just accommodates for a limited range of lower frequencies of the amplitude correction signal 309, making the SMPS 404 much easier and more cost-effective to implement. Combining the SMPS 404 with the linear regulator 402 enables high bandwidths of operation accommodating for full frequency ranges of the amplitude correction signal 309 without sacrificing the overall efficiency of the RF PA 104 system in any significant way, since most of the energy of the amplitude correction signal 309 that is contained in the low frequency part 403 of the amplitude correction signal 309 is processed by the more efficient SMPS 404 rather than the less efficient linear regulator 402.

For example, Table 1 below illustrates the percentage of energy contained in the various frequency ranges in a hypothetical simple 4QAM (Quadrature Amplitude Modulation) signal used in WCDMA cellular telephones and the overall efficiency that can be expected to be achieved by the RF transmitter according to the embodiment of FIG. 4A with the assumptions of the particular operating conditions as illustrated in Table 1. The combined amplitude and phase spectrum is 4 MHz wide.

TABLE 1

| 4QAM Signal<br>PA current = 100 mA<br>Adjusted supply<br>voltage 208 to PA = 60%<br>of Vbat on<br>average | Below<br>100 KHz<br>(Through<br>SMPS<br>404) | Above<br>100 KHz<br>(up to 40 MHz)<br>(Through Linear<br>Regulator 402) | All<br>Frequencies |
| --- | --- | --- | --- |
| Percentage of energy in adjusted supply voltage 208 to PA 104 in designated bandwidth | 83% | 17% | 100% |
| Efficiency of conversion at 60% of Vbat | 90% | 57% | 71% |

TABLE 1-continued

| 4QAM Signal<br>PA current = 100 mA<br>Adjusted supply<br>voltage 208 to PA = 60%<br>of Vbat on<br>average | Below<br>100 KHz<br>(Through<br>SMPS<br>404) | Above<br>100 KHz<br>(up to 40 MHz)<br>(Through Linear<br>Regulator 402) | All<br>Frequencies |
| --- | --- | --- | --- |
| Current from battery | 66.66 mA | 17.85 mA | 84.51 mA |
| Power supply system efficiency using high and low bandwidth paths | | 71% | |

Despite the extremely narrow bandwidth (100 KHz) of the SMPS 404 shown in the example of Table 1, 71% efficiency in the RF power amplifier supply system according to the embodiment of FIG. 4A can be expected under the above hypothetical conditions by using a 90% efficient SMPS 404 combined with a 57% efficient linear regulator 402. This is a very significant improvement over conventional PA controller systems that would typically use only a linear regulator under the same operating conditions and thus would be only 57% efficient. By using an SMPS 404 with an increased bandwidth, it is possible to improve the efficiency of the RF power amplifier even further.

Figure 4B:
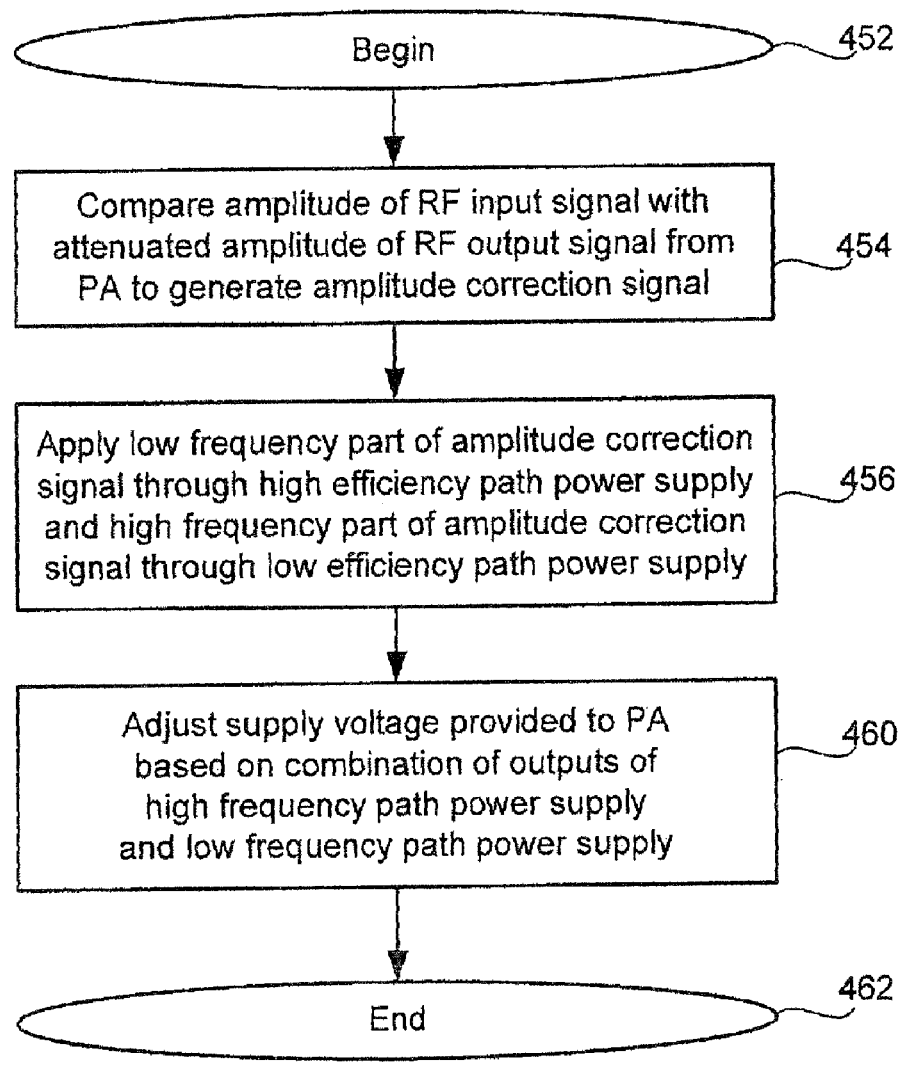
FIG. 4B illustrates a method of controlling the amplitude control loop of a RF PA system, in accordance with the second embodiment of the present invention.

FIG. 4B illustrates a method of controlling the amplitude control loop of a RF PA in an RF PA system, in accordance with the second embodiment of the present invention. FIG. 4B is explained in conjunction with FIG. 4A. Referring to both FIGS. 4A and 4B, as the process begins 452, the comparator 308 compares 454 the amplitude 323 of the RF input signal 204 with the attenuated amplitude 322 of the RF output signal from the PA 104 to generate an amplitude correction signal 309. The low frequency part 403 of the amplitude correction signal 309 is applied 456 to the high efficiency SMPS 404 while the high frequency part 401 of the amplitude correction signal 309 is applied 456 to the low efficiency linear regulator 402. The supply voltage 208 to the PA 104 is adjusted 460 based upon the combination of the outputs 407, 405 of the high efficiency SMPS 404 and the low efficiency linear regulator 402, and the process ends 462.

Figure 5A:
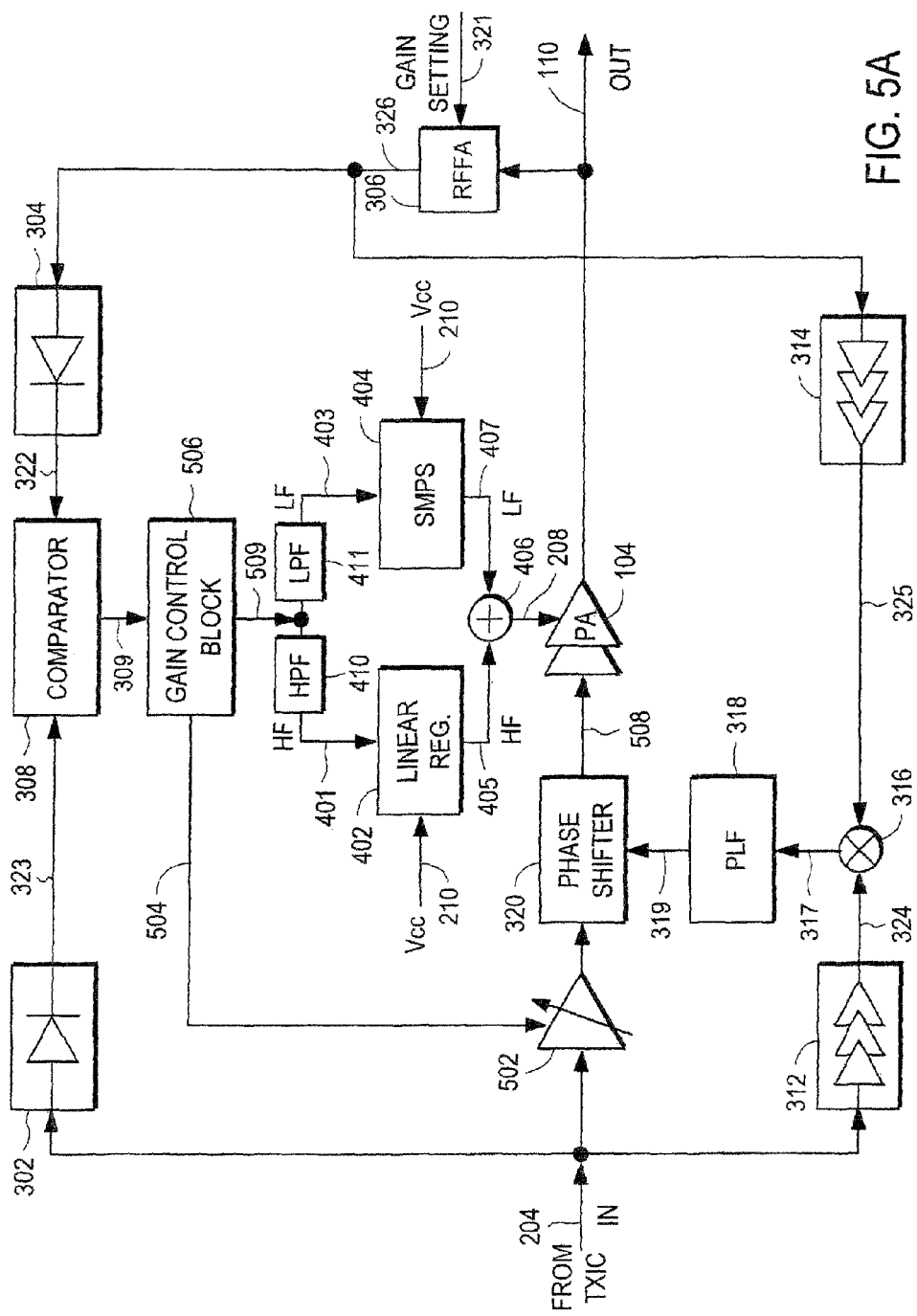
FIG. 5A illustrates an RF power amplifier system in accordance with a third embodiment of the present invention.

FIG. 5A illustrates an RF PA 104 system, according to a third embodiment of the present invention. The RF transmitter system illustrated in FIG. 5A is substantially the same as the RF transmitter system illustrated in FIG. 4A, except that the gain control block 506 and the variable gain amplifier 502 are added to provide an additional means to control the efficiency of the PA 104 and the overall RF transmitter system. Although the third embodiment of FIG. 5A is illustrated herein as an improvement to the second embodiment of FIG. 4A, note that the same concepts of the third embodiment of FIG. 5A can also be used to improve the first embodiment of FIG. 3A.

More specifically, the gain control block 506 receives the amplitude correction signal 309 and adjusts the gain of the variable gain amplifier 502 based upon the amplitude correction signal 309, as well as passing the low frequency and high frequency parts 403, 401 of the amplitude correction signal 309 to the SMPS 404 and the linear regulator 402, respectively, to generate the adjusted supply voltage 208 as explained above with reference to FIG. 4A. By monitoring the amplitude of the amplitude correction signal 309 input to the gain control block 506, a control signal 504 is created to further compensate the gain of the variable gain amplifier 502 before the PA 104. This arrangement allows the use of even lower bandwidth for the PA controller system as compared to that of the second embodiment described in FIG. 4A above.

Also the programmability of the output power can now be entirely left to the PA controller 202, while in the embodiment of FIG. 4A changing the output power required a change in gain in the transmitter IC 102.

With the addition of the variable gain amplifier 502 and the gain control block 506, it is possible to use the PA 104 at any given depth beyond its compression point. The term "depth beyond compression" is used herein to refer to the difference between the averaged input compression level of the PA 104 and the actual averaged input power at the PA 104. For instance, when the peak output power is required, the input to the PA 104 can be overdriven by 10 dB beyond the 1 dB compression point of the PA 104. It is also possible to adjust the supply voltage of the PA 104 at the instant when the peak power is required, such that the 1 dB compression point is set higher and it is only necessary to overdrive the PA 104 input by 3 dB to obtain the same output peak power. A dynamic adjustment of both the input level and the supply voltage allows this loop system to reduce significantly further the amplitude of the control voltage 208.

In the embodiment of FIG. 5A, the independent programming of gain and compression point by the closed amplitude control loop also makes it possible to reduce the amount of high frequency energy that the power supply system (linear regulator) has to deliver to the PA 104. This can be done by having the variable gain amplifier 502 correct for some of the gain error at a higher speed than the Vcc control loop (closed on node 208) can do, thus reducing the amount of correction that is to be done by the low efficiency, high frequency branch (linear regulator 401). Thus, the bandwidth of the signals at nodes 208 and 504 can be made to be significantly different. Since only a small fraction of the energy resides at high frequencies, there is only a small penalty in efficiency for reducing the bandwidth of the control at node 208 relative to the bandwidth at node 504. The ratio of the two active bandwidths is part of the design trade-off for the whole system. The gain control block 506 adjusts the compression point while the gain loop remains closed through the variable gain amplifier 502. This allows the RF controller system to search an optimum depth beyond compression (as measured by the absolute value of the amplitude correction signal 309 or alternatively by the averaged value of the gain control 504) and efficiency with less effect on the resulting signal quality. The search for the optimum depth beyond compression can be made by a slow control loop which monitors the absolute value of the amplitude correction signal 309, as well as its derivative. Another alternative is to monitor the averaged value of the gain control signal 504. In order to control the relative action of both amplitude controls 504 and 208, and in particular control the maximum voltage at node 208, a control system for the compression level of the variable gain amplifier 502 can be implemented. Because in the embodiment of FIG. 5A both the supply voltage 208 to the PA 104 and the input 508 to the PA 104 can be adjusted, this embodiment inherently offers greater flexibility in design by exploiting two sources of signal information for control. This allows to further reduce the amplitude of the variation of the voltage control signal 208, as shown on FIG. 7, where the voltage with the smallest variation is the signal labeled 703, corresponding to this third embodiment of FIG. 5A.

In addition, the third embodiment of FIG. 5A is also well suited to process directly a polar representation of the RF signal. In this case, an amplitude signal from the TXIC 102 would couple to the amplitude detector 302 and a phase only signal from the TXIC 102 would be coupled to the variable gain amplifier 502 and the limiter 312.

Figure 5B:
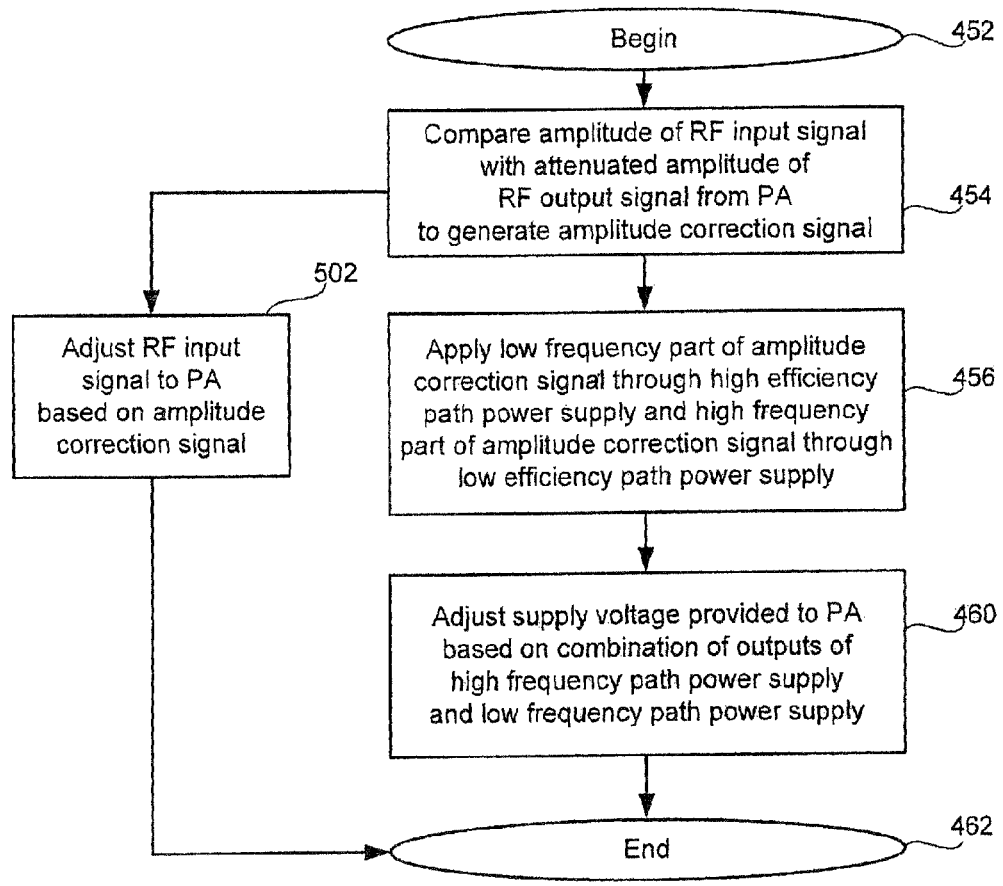
FIG. 5B illustrates a method of controlling the amplitude control loop of a RF PA system, in accordance with the third embodiment of the present invention.

FIG. 5B illustrates a method of controlling the amplitude control loop of a RF PA in an RF transmitter system, in accordance with the third embodiment of the present invention. The method illustrated in FIG. 5B is substantially the same as the method illustrated in FIG. 5A, except that step 502 is added. In step 502, the input signal 508 to the PA 104 is adjusted, by use of a variable gain amplifier 502, based upon the amplitude correction signal 309. Therefore, the method of FIG. 5B is provided with an additional means for controlling the efficiency of the PA 104 and the overall RF PA 104 system.

Figure 6:
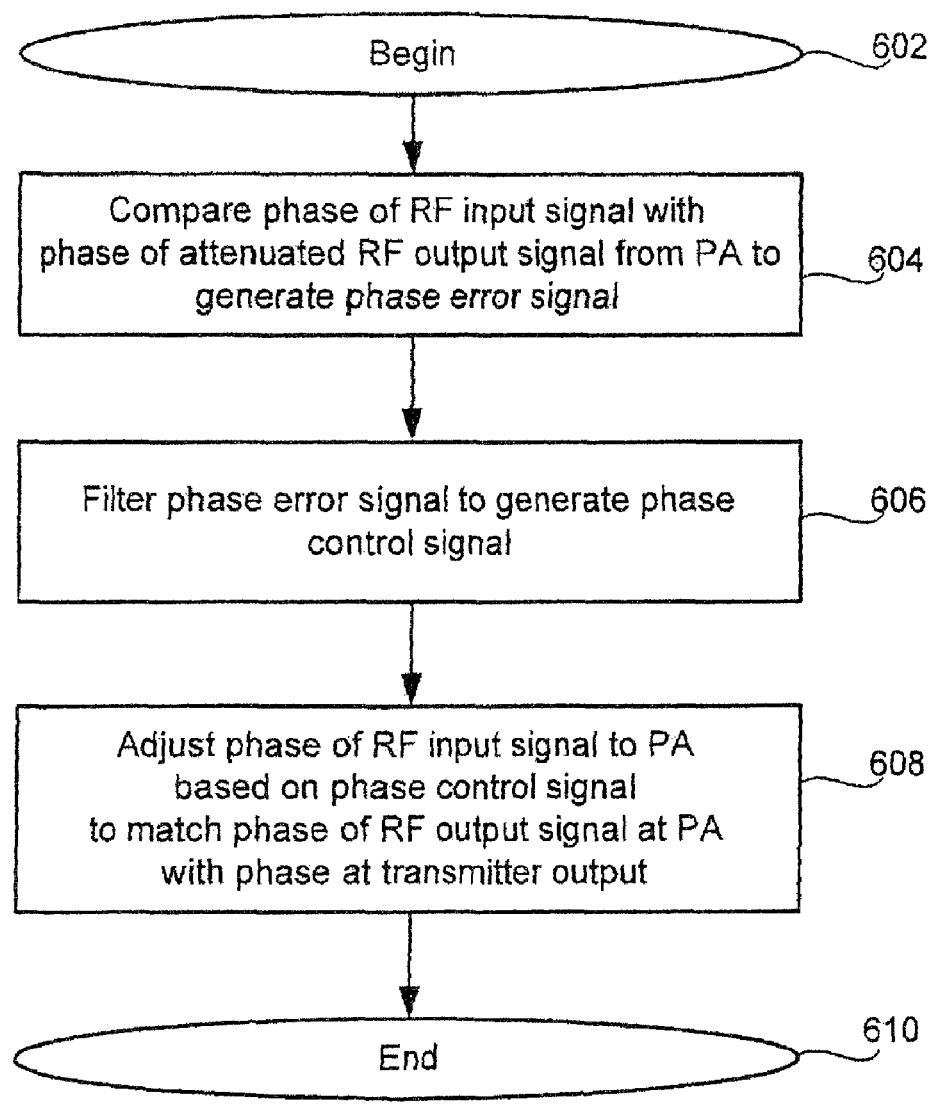
FIG. 6 illustrates a method of controlling the phase control loop of a RF power amplifier system in accordance with the present invention.

FIG. 6 illustrates a method of controlling the phase control loop of a RF PA in an RF PA system in accordance with the present invention. The phase control method of FIG. 6 can be used with any one of the methods of controlling the amplitude correction loops described in FIGS. 3B, 4B, and 5B, as shown in FIGS. 3A, 4A, and 5A. The method of FIG. 6 will be explained in conjunction with FIGS. 3A, 4A, and 5A.

As the process begins 602, the comparator 316 compares 604 the phase of the RF, input signal 204 with the phase of the attenuated RF output signal 326 from the PA 104 to generate the phase error signal 317. The phase error signal 316 is filtered 606 by the loop filter (PLF) 318 to generate the phase control signal 319. The phase of the input RF signal 204 is shifted 608 based upon the phase control signal 319 so that the difference between the phase of the input signal 204 and the phase of the output RF signal 110 is held constant, and the process ends 610.

FIG. 7 illustrates simulation results of the changes in the waveform of the supply voltage 208 to the PA corresponding to the conventional polar control method, the first embodiment of FIG. 3A, and the third embodiment of FIG. 5A, for a typical commercial WCDMA PA with 3.4 V nominal supply voltage and WCDMA modulation using 3.84 Mchips per second. As explained previously, the adjusted supply voltage 208 generated by a conventional polar system as indicated by curve 701 varies the most with wide fluctuations, the adjusted supply voltage 208 generated by the first embodiment of FIG. 3A as indicated by curve 702 varies less than the curve 701, and the adjusted supply voltage 703 generated by the third embodiment of FIG. 5A varies the least with only a little fluctuation.

Figure 8:
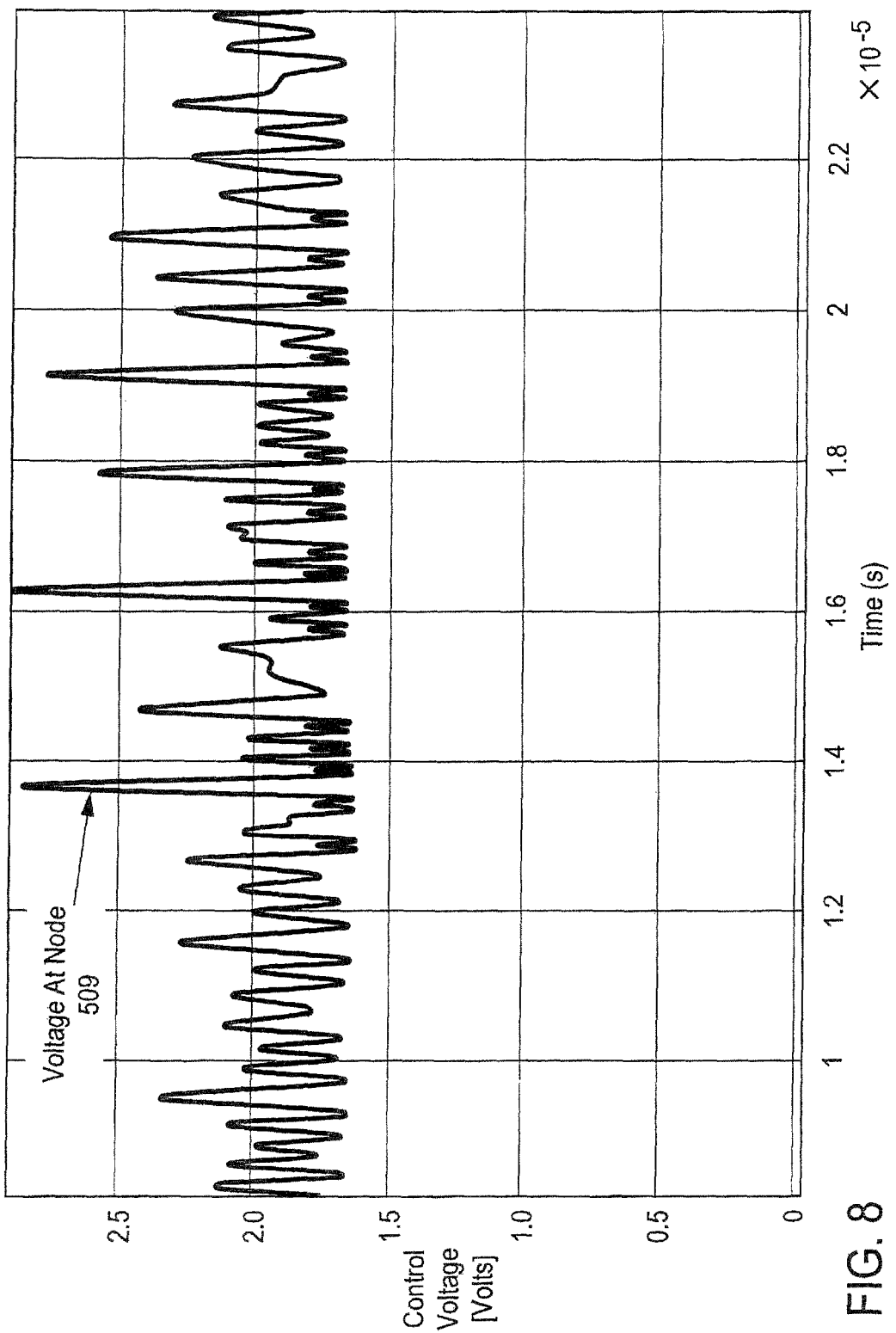
FIG. 8 illustrates the simulation results of an example of a time domain waveform present at the node 509 of FIG. 5A for a typical commercial WCDMA PA with 3.4 V nominal supply voltage and WCDMA modulation using 3.84 Mchips per second.
Figure 9:
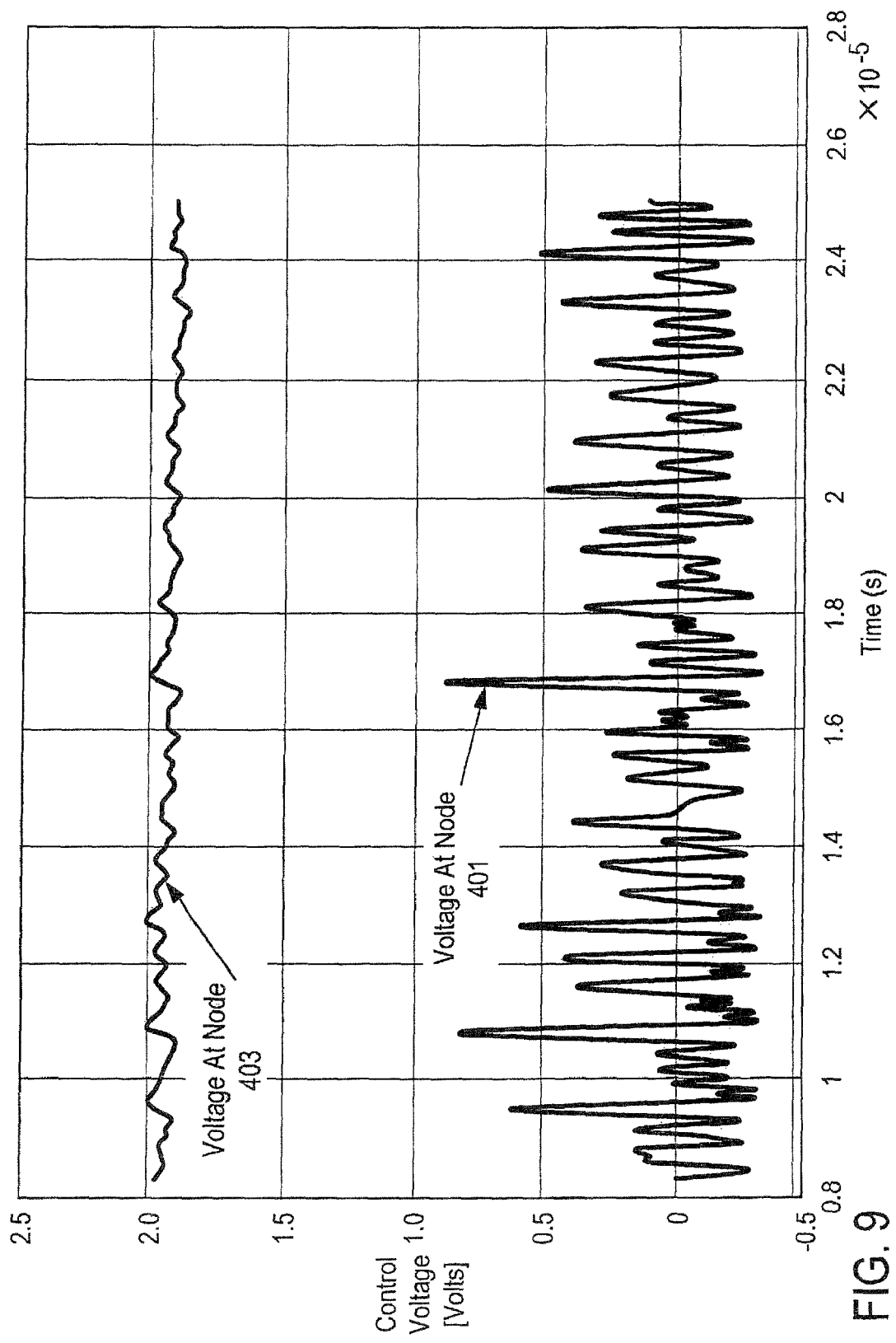
FIG. 9 illustrates the simulation results of an example of a time domain waveform present at nodes 401 and 403 of FIG. 5A for a typical commercial WCDMA PA with 3.4 V nominal supply voltage and WCDMA modulation using 3.84 Mchips per second.

FIG. 8 illustrates the simulation results of an example of a time domain waveform present at node 509 (which voltage would be the same as the voltage at node 309) of FIG. 5A, and FIG. 9 illustrates the simulation results of an example of a time domain waveform present at nodes 401 and 403 of FIG. 5A, both for a typical commercial WCDMA PA with 3.4 V nominal supply voltage and WCDMA modulation using 3.84 Mchips per second. The loop voltage versus time on FIG. 8 shows that the loops maintain a voltage much lower than 2.5 V most of the time, except for some short instants. This is due to the signal's amplitude characteristics which require high peaks but a much lower average. In FIG. 9, the voltages 401 and 403 are shown. They correspond to the voltage 309 (or 509) after filtering by a 100 kHz high pass filter 410 and a 100 kHz low pass filter 411, respectively. It can be seen that the low pass filtered signal 403 is almost a DC signal of value 1.9 V, while the high pass filtered signal 401 is a band limited waveform having a low DC value and an arms value of only 0.2V. If the 1.9V is generated with an efficiency of 90% by an easy-to-realize low output bandwidth SMPS 404, and the 0.2V is generated with an efficiency of 60% using a linear amplifier 402, the signal 309 can be generated with a combined efficiency of $(1.9+0.2)/(1.9/0.9+0.2/0.6)=87.5\%$. This is much better than generating the signal 309 using a linear regulator with an average efficiency of $(1.9/3.4)/1.05=53\%$.

While it should be understood that the calculations presented herein are engineering approximations, the potential benefit in battery life is clearly apparent through this example.

Upon reading this disclosure, those of skill in the art will appreciate still additional alternative structural and functional designs for the RF power amplifier controller through the disclosed principles of the present invention. For example, although the embodiment in FIG. 4B splits the amplitude correction signal 309 into two frequency ranges, it is possible to split the amplitude correction signal 309 into more than two different frequency ranges for separate processing by adjustable power supply components. The power amplifier controller circuit can be used with any type of power amplifier for many different types of electronic devices, although the embodiments are described herein with respect to a RF PA controller used in cellular telephone applications. Examples of these applications include video signals and Manchester coded data transmissions.

For another example, digital techniques can be used to process some of the signals of the PA system described herein. Whether a signal is represented in an analog form or a digital form will not change the functionality or principles of operation of amplitude and phase control loops of the PA system according to various embodiments of the present invention. For instance, based on the observation of the amplitude error signal 309, one could calculate a typical transfer function for the PA 104 and construct the signals that drive the PA 104 at nodes 206, 208, which is still a form of closed loop control.

Figure 10A:
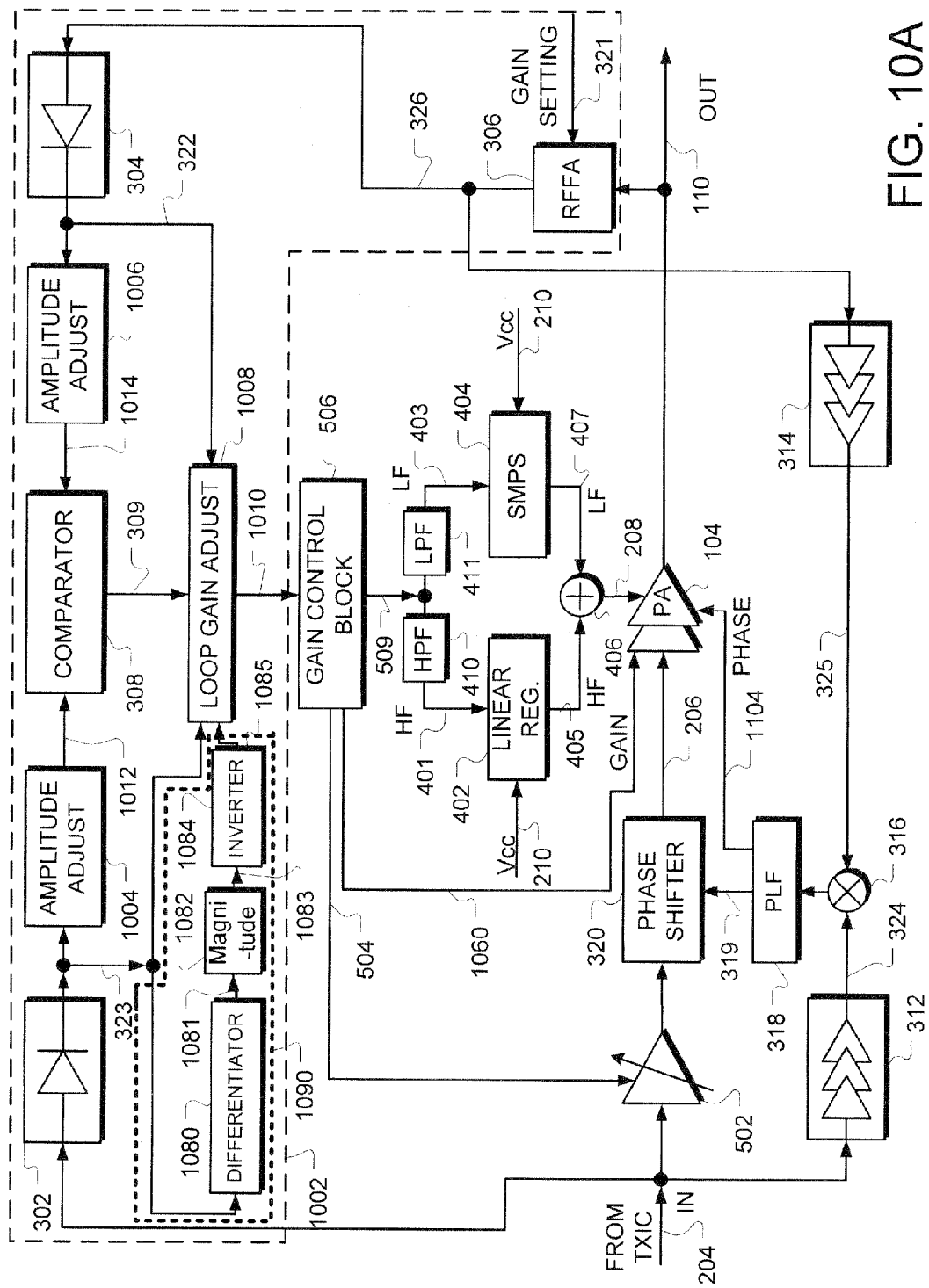
FIG. 10A is a block diagram of an example of an RF power amplifier system according to the fourth embodiment.

FIG. 10A includes elements of an RF PA system according to the fourth embodiment. The RF PA system illustrated in FIG. 10A is similar to the RF PA system illustrated in FIG. 5A. In FIG. 10A, the amplitude control loop section includes additional elements shown within detail 1002. Although the embodiments described with reference to FIG. 10A are illustrated herein as improvements to the third embodiment of FIG. 5A, note that the same concepts of the embodiments of FIG. 10A can also be used to improve the first and second embodiments described with reference to FIGS. 3A and 4A, respectively.

Figure 11:
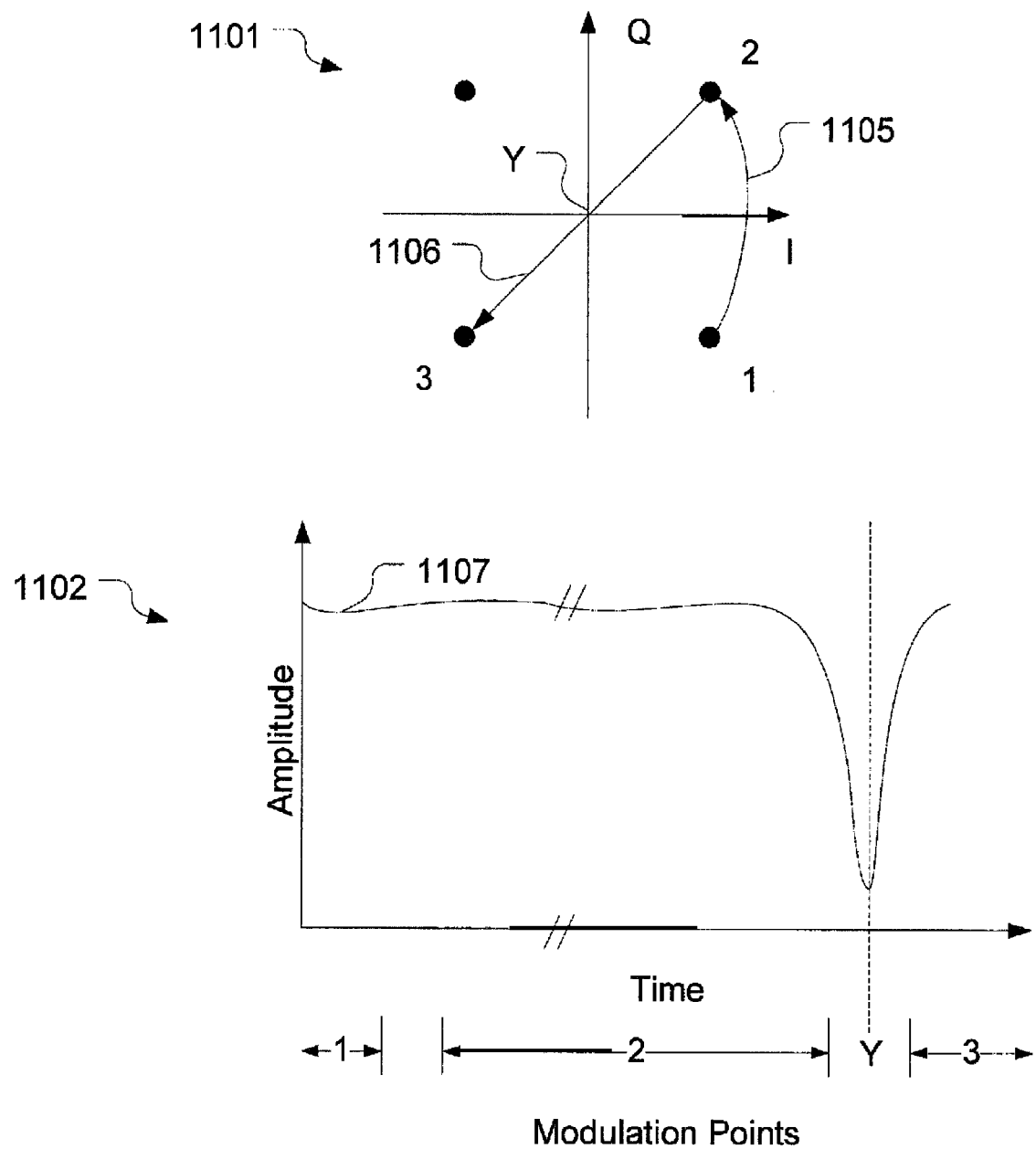
FIG. 11 is a series of charts illustrating an example of signal modulation.

It is instructive to describe an example of signals which may be present in the RF PA system illustrated in FIG. 10A. FIG. 11 is a chart illustrating an example of signal modulation that may be applied as the input signal 204. For example, the input signal 204 may be modulated with a quadrature phase shift keying (QPSK) modulation. Chart 1101 is a constellation diagram illustrating QPSK modulation. Transition 1105 shows the trajectory from point 1 to point 2. Transition 1106 shows the trajectory from point 2 to point 3. Point Y marks a location on the transition 1106 where the transition 1106 passes through or near the origin. As indicated by the arrows on trajectories 1105 and 1106, in this example, as time passes the trajectory goes from point 1 to point 2, and from point 2 through point Y to point 3.

Chart 1102 shows the amplitude 1107 of the modulated signal versus time. Points 1, 2, Y, and 3 are indicated to show the position of the trajectory with respect to these points. When the trajectory 1106 passes through or near point Y, the amplitude 1107 passes through a minimum. Note that in this example shown, the time spent at point 2 is longer that the time transitioning between points 1 and 2, and points 2 and 3. Thus, a relatively rapid amplitude reduction results when the modulated signal passes through or near the constellation origin in the modulation.

Figure 12:
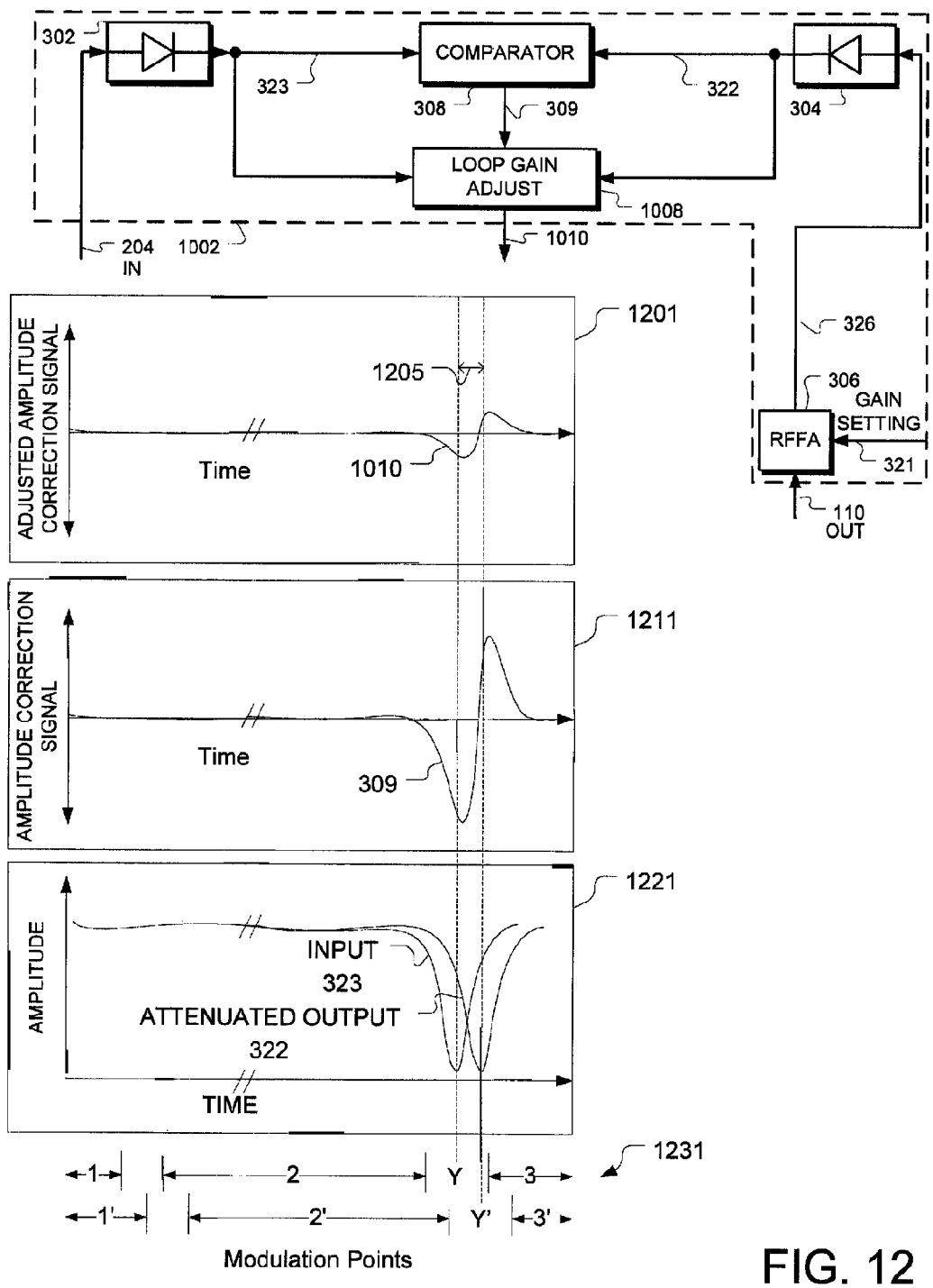
FIG. 12 is a series of charts illustrating an example of the effect of a loop gain adjust block in an RF power amplifier system according to the fourth embodiment.

FIG. 12 is a series of charts illustrating the modulation shown in FIG. 11 applied as the RF input signal 204 of FIG. 10A, and shows a detail 1002 of the amplitude loop to show the signals present in the circuit. Chart 1221 depicts the amplitudes seen by amplitude comparator 308, corresponding to the amplitude of input signal 204, and the amplitude of output signal 110 after passing through attenuator 306.

Amplitude comparator input signal 323 is equivalent to amplitude signal 1107 in FIG. 11. Thus, in this example, the signal passes through modulation points 1, 2, and 3, transitioning through or near constellation origin point Y during the transition 1106 from point 2 to point 3. The time spent at the various modulation points are as shown in chart 1231. The attenuated output signal 322, however, lags due to the delay through the RF PA by time 1205. Thus, chart 1231 shows a delayed set of modulation points 1',2', and 3', corresponding to the modulation points in the PA output and, consequently, in the attenuated output signal 322.

By inspection of chart 1221, it can be seen that the inputs 323 and 322 to comparator 308 diverge for a period around the time shown in chart 1231 as points Y and Y', due to the relatively rapid amplitude change of the input signal 204 as the modulated signal moves through or near the constellation origin point Y in the modulation. The amplitude correction signal 309 from comparator 308 is shown in chart 1211. The amplitude correction signal 309 represents the difference of signals 322 and 323, and thus exhibits the rapid glitch-shaped signal depicted in chart 1211.

Referring back to FIG. 10A, passing signal 309 as depicted in chart 1211 directly to gain control block 506 (by omitting loop gain adjust block 1008) may cause any or all of the elements SMPS 404, linear regulator 402, and VGA 502 to respond to the glitch-shaped amplitude correction signal 309, resulting in some distortion at PA output 110. Therefore, it is advantageous to reduce the action of the loop and thus limit the degree to which the SMPS 404 and linear regulator 402 may adjust the voltage to the PA, and the degree to which the VGA 502 would adjust its gain, during the periods of rapid amplitude change of the input signal. While periods of rapid amplitude change of the input signal are shown here as associated with the signal transition passing through or near the constellation origin in the modulation, rapid amplitude changes at the input signal may occur at other times, depending, for example, on the type of modulation used. In these cases, as well, it is advantageous to reduce the action of the loop.

One example of reducing the action of the loop is to reduce the gain of the loop. In one example, the gain of the loop can be reduced by reducing the level of the signals in the correction path of the loop. One convenient means of controlling the correction path of the loop is to adjust the amplitude correction signal 309 before it is passed on to gain control block 506. Additional methods include reducing the degree to which the power supply 104 (comprised in this example of linear regulator 402 or SMPS 404) adjusts supply voltage 208 to PA. The degree to which VGA 502 adjusts its gain based on gain adjust signal 504 may also be reduced. Any method which reduces the gain of the loop may be used.

Referring to FIG. 10A, in an example of the fourth embodiment, the loop gain adjust block 1008 is configured to pass a reduced level of amplitude correction signal 309 as the adjusted amplitude correction signal 1010 when a rapid change in the amplitude of input signal 204 is indicated.

One example of detecting a rapid change in amplitude of the input signal is shown in circuitry 1090. Differentiator 1080 is employed to measure the rate of change of input amplitude 323. Differentiator output 1081 is provided to magnitude block 1082. Since a differentiator may indicate a negative output for a decreasing signal and a positive output for an increasing signal, the magnitude of the output 1081 can be obtained using the magnitude block 1082. Thus, the output magnitude 1083 is the magnitude of the differentiator output 1081.

Output magnitude 1083 of differentiator 1080 increases in value with an increase in the rate of change in input amplitude 323. Inverter 1084 inverts output magnitude 1083 of differentiator 1080, so that inverter output signal 1085 fed to loop gain adjust block 1008 decreases in value with an increase in the rate of change of amplitude of input amplitude 323. In this example, loop gain adjust block 1008 is configured to reduce the level of amplitude correction signal 309 to generate the adjusted amplitude correction signal 1010, in response to a decrease in the inverter output signal 1085. Thus, when input signal 204 experiences a rapid change in amplitude, the signal level at inverter output 1085 decreases, and the level of adjusted amplitude correction signal 1010 is decreased relative to amplitude correction signal 309. This in turn reduces the gain of the loop during periods when the amplitude correction signal 309 may be generating a glitch-shaped signal, as previously described, and so reduces distortion caused by the response of SMPS 404 and linear regulator 402.

While circuitry 1090 describes one example of detecting a rapid change in amplitude of the input signal 204, any other method may be used. A rapid change of amplitude may be detected in the output signal 110, or the attenuated output signal 326, either as an alternative to detecting a rapid change in amplitude of the input signal 204, or in addition to detecting a rapid change in amplitude of the input signal 204. There are some benefits to detecting a rapid change in amplitude at both the input signal 204 and output signal 110, as will be described later.

As described previously, periods of rapid amplitude change of the input signal 204 are often associated with signal transitions passing through or near the constellation origin in the modulation. Since these signal transitions are also associated with a relative decrease in signal amplitude, a relative decrease in the detected input amplitude may be associated with a period of rapid input amplitude change. Thus, loop gain adjust block 1008 may alternatively use the amplitude 323 of the input signal 204 to reduce the level of amplitude correction signal 309. As the detected input amplitude 323 is reduced, an adjusted amplitude correction signal 1010 is reduced by the loop gain adjust block 1008. The adjusted amplitude correction signal 1010 is then passed on to the gain control block 506. FIG. 12 shows an example of the adjusted amplitude correction signal 1010, shown in chart 1201. Thus, as in the previous example, the gain of the loop is reduced during periods when the amplitude correction signal 309 may be generating a glitch-shaped signal, and so the distortion caused by the response of SMPS 404 and linear regulator 402 is reduced.

One example of the loop gain adjust block 1008 is a multiplier. Using this example of loop gain adjust block 1008 and the example described which uses input amplitude 323 to adjust adjusted amplitude correction signal 1010, the loop gain adjust block 1008 operates as follows. The input amplitude signal 323 is multiplied with the amplitude correction signal 309 in the loop gain adjust block 1008. When the amplitude of input signal 204 is relatively high, the amplitude correction signal 309 is multiplied with a signal that is relatively high. Similarly, when the amplitude of the input signal 204 is relatively low, the amplitude correction signal 309 is multiplied by a signal that is relatively low. Since the periods of rapid amplitude change of the input signal 204 are associated with a relative reduction in amplitude (as the input signal 204 passes through a transition through or near the constellation origin in the modulation), multiplying the signal in this manner accomplishes the goal of reducing the action of the loop during these periods and reduces distortion at the output 110.

As another example, the loop gain adjust block 1008 may be a variable gain amplifier. In this example, the input amplitude signal 323 is used as the control for the gain of the variable gain amplifier. When the input signal 204 is relatively low, the gain of the variable gain amplifier may be reduced to reduce the level of amplitude correction signal 304, and generate the adjusted amplitude correction signal 1010. Although a multiplier and a variable gain amplifier have been described as part of a loop gain adjust block 1008 to reduce the level of the amplitude correction signal 304, any circuit that can scale a first signal with a second signal can be used to reduce the level of the amplitude correction signal 304.

An additional benefit of reducing the level of a glitch in the amplitude correction signal 309 is as follows. Circuitry controlled by adjusted amplitude correction signal 1010 may be optimized to handle a modest degree of amplitude adjustment. For example, if the amplitude correction signal 309 of chart 1211 as shown in FIG. 12 were applied to control the gain adjustment input 504 of VGA 502, it is possible that signal level would exceed the normal operating range of gain control signal 504. In response, VGA 502 could generate additional distortion as it abruptly reaches its maximum or minimum gain setting.

Note also that, while the action of the amplitude correction loop is periodically reduced as described, the overall effect on the normal corrective action of the amplitude loop is minimal. Referring back to FIG. 11, the time around point Y, in which the adjusted amplitude correction signal 1010 is reduced as described above, is relatively small as compared with the time spent at modulation points 1, 2, or 3. Although, during such a time, the operation of the amplitude control loop approaches an open-loop condition and a small amount of residual distortion may be introduced, most of the time the amplitude loop operates in a closed loop manner. Note that even while in the open-loop condition, the PA output 110 still tracks the input 204, but with less accuracy than in the closed-loop condition. Additionally, note that the output signal amplitude 110 is relatively low during the time when the loop approaches an open-loop condition. As a result, the power of the residual distortion in the output signal during this time is relatively small.

As mentioned before, FIGS. 10A, 10B, 10C, and 10D are shown as improvements to the third embodiment of FIG. 5A, and therefore show the adjusted amplitude correction signal 1010, 1020, 1030, and 1040 as coupled to gain control block 506 in FIGS. 10A, 10B, 10C, and 10D, respectively. However, the same concepts of the embodiment of FIG. 10A can also be used to improve the first and second embodiments of FIGS. 3A and 4A, respectively, and as applied to these embodiments, the adjusted amplitude correction signal would be coupled to the appropriate blocks as shown in FIGS. 3A and 4A.

Also, while gain control block 506 is shown as adjusting the gain of VGA 502, gain control block 506 may alternatively adjust the gain of PA 104, if PA 104 is of a type which allows such a gain adjustment. Thus, in any of the examples described, an adjustment of a gain of VGA 502 may be considered equivalent to an adjustment of a gain of PA 104.

Referring back to FIG. 10A, in another example of the fourth embodiment, the attenuated amplitude 322 of the output signal 110 is input to the loop gain adjust block 1008. As shown in FIG. 12, chart 1221, a relative reduction in amplitude of the output signal is correlated with a transition through or near the constellation origin in the modulation, which results in a relatively rapid amplitude change. If the attenuated amplitude 322 of the output signal 110 is multiplied with the amplitude correction signal 309 to generate the adjusted amplitude correction signal 1010, the action of the loop during these periods is reduced, and results in reduced distortion at the output 110.

FIG. 10A includes elements of a block diagram of an RF power amplifier system according to another example of the fourth embodiment. In this example, the input amplitude 323 and the attenuated amplitude 322 of the output signal 110 are both input to the correction block 1008. Using a multiplier as an example of the correction block 1008 in this example, the amplitude correction signal 309 is multiplied by both the input amplitude signal 323 and the attenuated output amplitude signal 322. Thus, if either the input amplitude signal 323 or the attenuated output amplitude signal 322 is relatively low, the contribution of a large amplitude error on the amplitude correction signal 309 to the adjusted amplitude error signal 1010 is reduced. If there is substantial delay between input 204 and output 110, there is a benefit to this example, since both leading and falling edges of the large amplitude error may be reduced.

FIG. 10A includes elements of a block diagram of an RF power amplifier system according to yet another example. Amplitude adjust blocks 1004 and 1006 can provide a lower limit to the input amplitude 323 and attenuated output amplitude 322, respectively, before they are input to the amplitude comparator 308. Thus, as the input amplitude signal 323 and the attenuated output amplitude signal 322 reduce in amplitude during a transition through or near the constellation origin in the modulation, the inputs 1012 and 1014 to the amplitude comparator reduce to a modest and relatively equal value, reducing the gain of the amplitude loop, and reducing the amplitude of the glitch at the adjusted amplitude correction signal 1010.

While FIG. 10A describes several techniques in which the gain of the loop may be reduced in response to a relative decrease in signal amplitude, there are other methods as well. For example, the response of VGA 502 to VGA control signal 504 may be reduced, as well as the response of linear regulator 402 and SMPS 404 to control signal 509. Any method of reducing gain of the loop may be used.

Figure 10B:
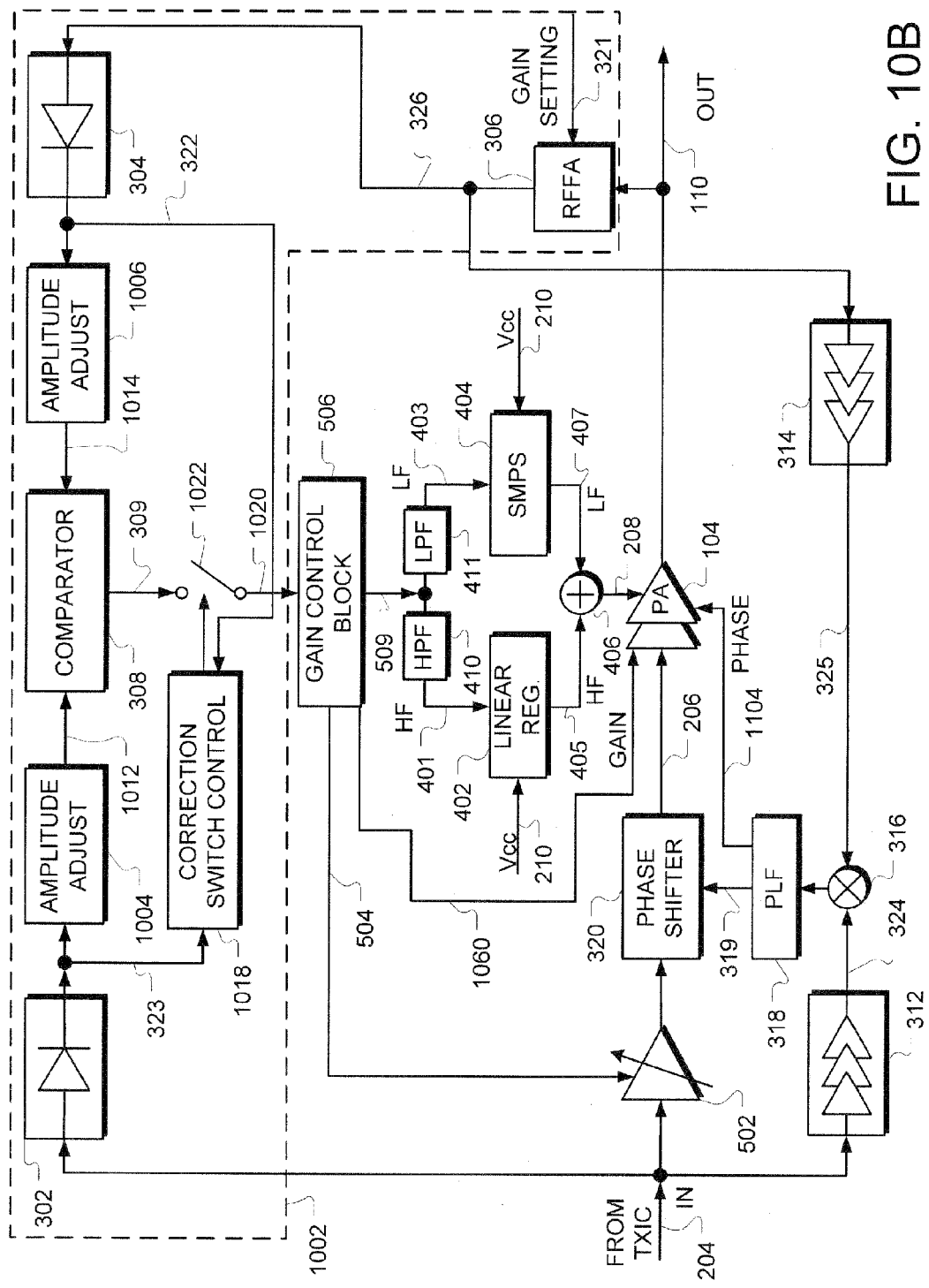
FIG. 10B is a block diagram of an example of an RF power amplifier system according to the fourth embodiment.

FIG. 10B is a block diagram of an RF power amplifier system which includes elements of another example. The RF power amplifier system includes a switching circuit 1022 coupled to the output of the amplitude comparator 309. A correction switch control block 1018 controls the switching circuit 1022 in response to the input amplitude 323. Although the correction switch control block 1018 and the switching circuit 1022 have been described as distinct, the correction switch control block 1018 and the switching circuit 1022 may be combined together into a single switching circuit.

In this example the correction switch control block 1018 compares the amplitude of the input amplitude 323 to a threshold. The threshold may be represented in a variety of ways. For example, the threshold may be a voltage or a current. The threshold may be generated from a value stored in a register or generated by a resistor network. Any technique appropriate for the comparison in the correction switch control block 1018 may be used.

In response to the comparison, the correction switch control block 1018 controls the switching circuit 1022 to selectively pass the amplitude correction signal 309. For example, if the level of the input amplitude 323 is below the threshold, the switching circuit 1018 may block the amplitude correction signal 309. Since the rapid amplitude changes during modulation state transitions through or near the constellation origin are correlated to a relative decrease in amplitude, the amplitude errors on the amplitude correction signal 309 would be blocked from being passed to adjusted amplitude correction signal 1020 during these times, thus blocking the glitch at the amplitude correction signal 309.

The switching circuit 1022 may take many forms. For example, the switching circuit 1022 may be a single transistor. When the amplitude is greater than the threshold, the correction switch control block 1018 turns on the transistor to pass the amplitude correction signal 309. Alternatively, when the amplitude is less than the threshold, the correction switch control block 1018 turns off the transistor to block the amplitude correction signal 309. A capacitor or other charge storage device may be present within the switching circuit 1022 to hold the value of the amplitude correction signal 309 prior to turning off the transistor.

Alternatively, the switching circuit 1022 may be a multiplier as described above. For example, the correction switch control block 1018 may generate a two level signal from comparing the amplitude of input signal 323 to the threshold. Since two levels are generated from the correction switch control block 1018, even if the multiplier is an analog multiplier, it can be controlled such that the amplitude correction signal 309 is passed or blocked. For example, the two levels can be 1 and 0. Any circuit that can be used to selectively pass and block the amplitude correction signal 309 may be used as a switching circuit 1022.

In general, referring to FIG. 10A, the relationship of a signal used by the loop gain adjust block 1008 to adjust the amplitude correction signal 309 may, but need not have a linear relationship to the effect on the amplitude correction signal 309. For example, with multiplication using the amplitude as described before, the amplitude has a linear relationship to the scaling of the amplitude correction signal 309. In contrast, with the correction switch control block 1018 (FIG. 10B) and the multiplier described above, the relationship between the amplitude and the scaling of the amplitude correction signal 309 has a discrete step, thus it is non-linear. Any relationship of the amplitude to the scaling of the amplitude correction signal 309 may be used.

Figure 10C:
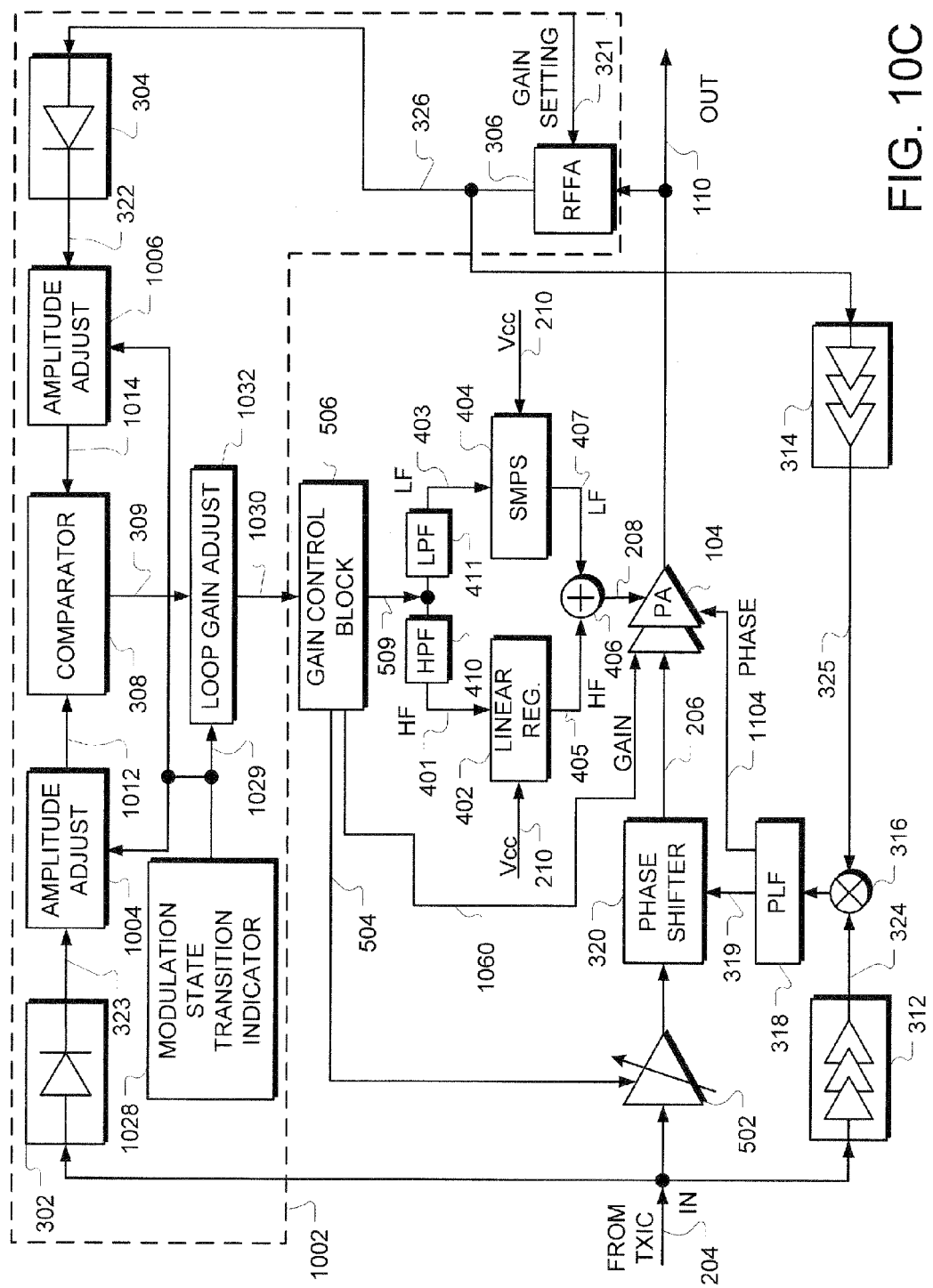
FIG. 10C is a block diagram of an example of an RF power amplifier system according to the fourth embodiment.

FIG. 10C is a block diagram of an RF PA system according to another example. The detail 1002 of the amplitude loop now includes a modulation state transition indicator circuit 1028. The modulation state transition indicator circuit 1028 generates a modulation state transition signal 1029, indicating a state transition of modulation of the input signal 204 in which the modulation state transitions through or near the constellation origin. The loop gain adjust block 1032 is responsive to the modulation state transition signal 1029. Although the modulation state transition signal 1029 indicates these transitions in the state of the modulation of the input signal 204, it may, but need not be directly generated from the input signal 204. As described below, various other signals may exist that include information on the modulation of the input signal 204 and may be used to generate the modulation state transition signal 1029.

For example, a digital signal processor may generate the modulation for an in-phase component I and a quadrature-phase component Q used to generate a QPSK modulated signal. In QPSK, a 180 degree phase shift occurs when both the in-phase component I and the quadrature-phase component Q change phase during the same transition. This phase transition occurs at a time synchronous with the modulation state transitioning through or near the constellation origin. Additionally, the digital signal processor may have timing information about the modulation that is synchronous with any rapid amplitude change. Thus, the digital signal processor may provide information to generate the modulation state transition signal 1029.

Figure 13:
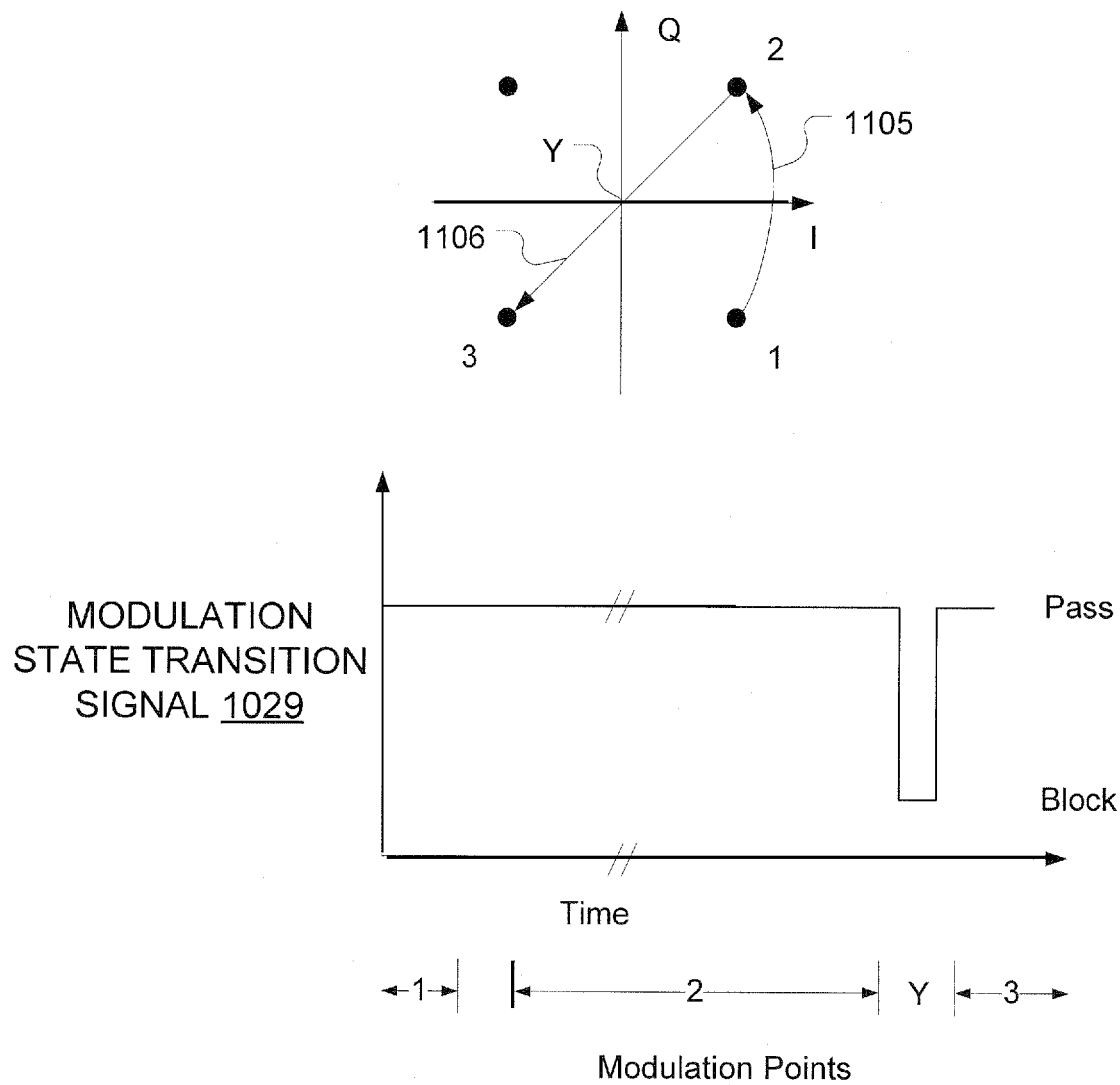
FIG. 13 is a timing diagram illustrating an example of a modulation state transition signal according to the fourth embodiment.

FIG. 13 is a timing diagram illustrating an example of a modulation state transition signal 1029 according to the fourth embodiment. The modulation state transition indicator circuit 1028 generates a modulation state transition signal 1029 from the modulation information of the in-phase component I and the quadrature-phase component Q. In this example, the points 1, 2, Y, and 3 correspond to the same points illustrated in FIG. 11. At point Y, both the in-phase component I and the quadrature-phase component Q are transitioning to the opposite state. During such a transition, the transition passes the origin of the constellation diagram, resulting in a 180 degree phase shift as well as a relative decrease in signal amplitude. Because the modulation state transition indicator circuit 1028 has this information, the modulation state transition signal 1029 may be generated. In this example the modulation state transition signal 1029 is in the block state for a period of time somewhat shorter than the transition time from points 2 to 3.

Although a particular width, shape, timing, and other characteristics of the modulation state transition signal 1029 has been described, the modulation state transition signal 1029 may have any width, shape, timing, or other characteristics as needed to reduce distortions due to amplitude errors. In addition, the modulation state signal 1029 may have a triangular, continuous, or other shape with more than two levels.

Although the use of a QPSK signal has been described above as illustration, any modulation format from which amplitude transition information is available or may be obtained may be used to generate the modulation state transition signal 1029. More complex modulation, including QAM and OFDM, may include various periods within the modulated signal which result in rapid amplitude changes, which in turn may cause glitches in the amplitude loop as described. Any information about the timing and nature of amplitude changes may be used by the modulation state transition indicator 1028 to determine the modulation state signal 1029, even if these amplitude changes occur during periods outside of a modulation transition period.

FIG. 10C includes elements of a block diagram of an RF power amplifier system according to another example. Amplitude adjust blocks 1004 and 1006 may adjust the input amplitude 323 and attenuated output amplitude 322, respectively, before they are input to the amplitude comparator 308, in response to the modulation state transition signal 1029. For example, if the modulation state transition signal indicates a period in which the modulation state transitions through or near the constellation origin, the amplitude adjust blocks 1004 and 1006 may cause the inputs 1012 and 1014 to the amplitude comparator to be limited such that they are not reduced below a modest and relatively equal value. As a result, the gain of the amplitude loop is reduced, reducing the amplitude of the glitch at the adjusted amplitude correction signal 1010.

While FIG. 10C describes several methods in which the gain of the loop may be reduced in response to the modulation state transition signal 1029, there are other methods as well. For example, the response of VGA 502 to VGA control signal 504 may be reduced, as well as the response of linear regulator 402 and SMPS 404 to control signal 509. Any method of reducing gain of the loop may be used.

Figure 10D:
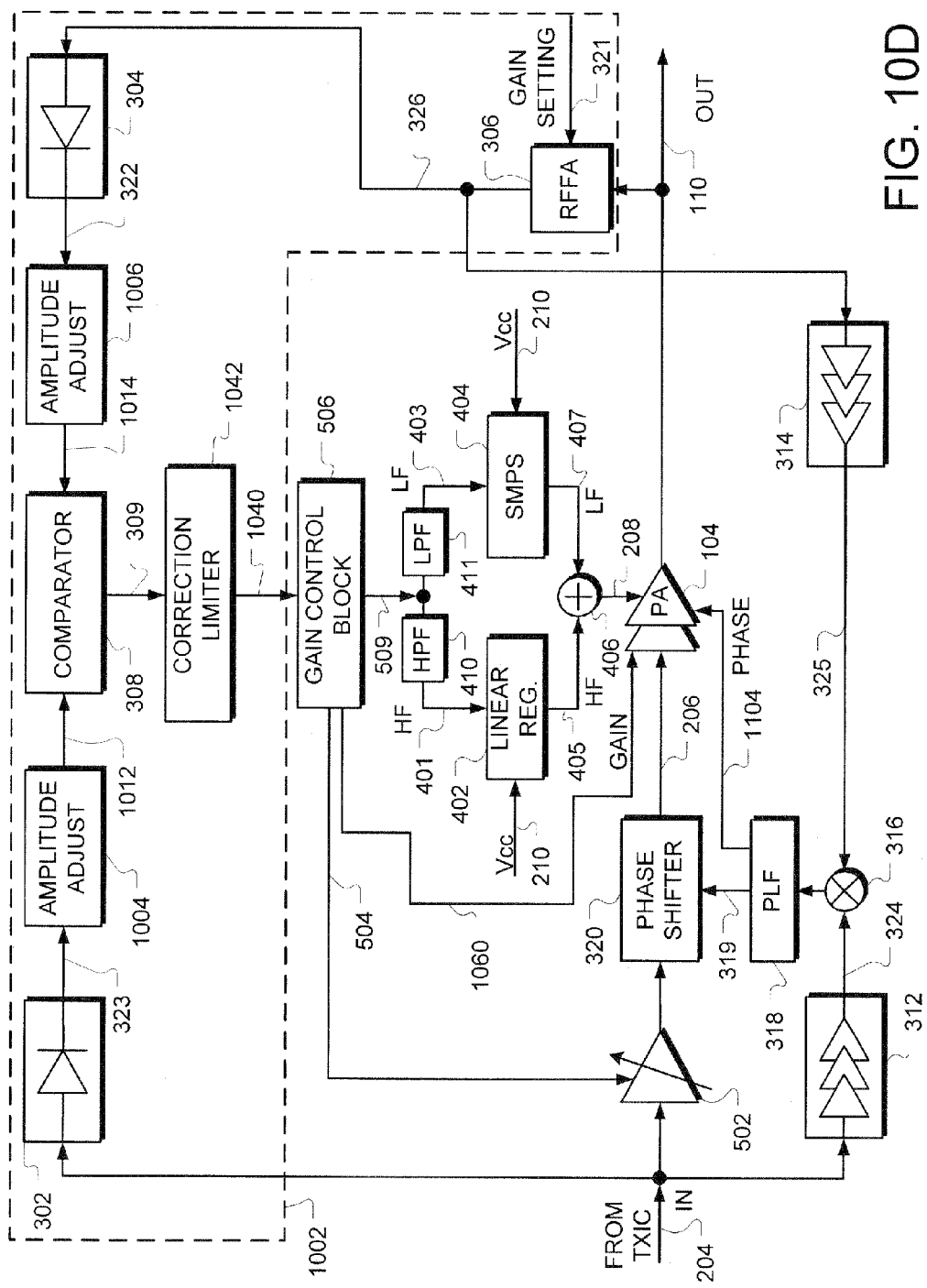
FIG. 10D is a block diagram of an example of an RF power amplifier system according to the fourth embodiment.

FIG. 10D is a block diagram of a RF PA system according to another example. The RF PA system includes a correction limiter circuit 1042. The correction limiter circuit 1042 is to limit an amplitude of the amplitude correction signal 309 to generate an adjusted amplitude correction signal 1040. The correction limiter circuit 1042 is to limit the amplitude of the amplitude correction signal if a magnitude of the amplitude correction signal 309 exceeds a threshold.

Any of a variety of circuits may be used for the correction limiter circuit 1042. For example a pair of diodes may limit the amplitude of the amplitude correction signal 309. Alternatively, an amplifier may include an output level control to limit the output swing. Any circuit that can limit, clip, or otherwise reduce the amplitude of a signal according to its amplitude may be used as a correction limiter circuit 1042.

Figure 14:
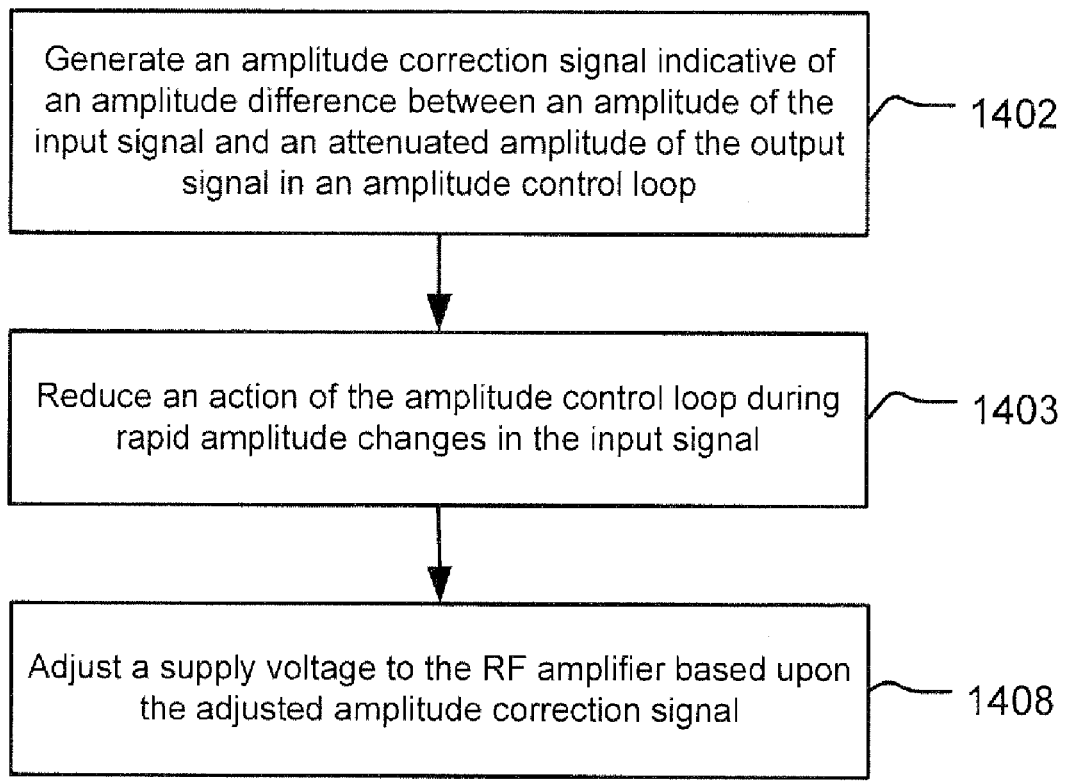
FIG. 14 illustrates an example of a method of operating an RF power amplifier system according to the fourth embodiment.

FIG. 14 illustrates an example of a method of operating an RF power amplifier system according to the fourth embodiment. The RF power amplifier coupled to receive and amplify an input signal to generate an output signal. In this example, the method includes generating an amplitude correction signal indicative of an amplitude difference between an amplitude of the input signal and an attenuated amplitude of the output signal in an amplitude control loop in 1402, reducing an action of the amplitude control loop during rapid amplitude changes in the input signal in 1403, and adjusting a supply voltage to the RF amplifier based upon the adjusted amplitude correction signal in 1408. By reducing the action of the amplitude control loop distortion of the signal can be reduced, as described above.

Figure 15:
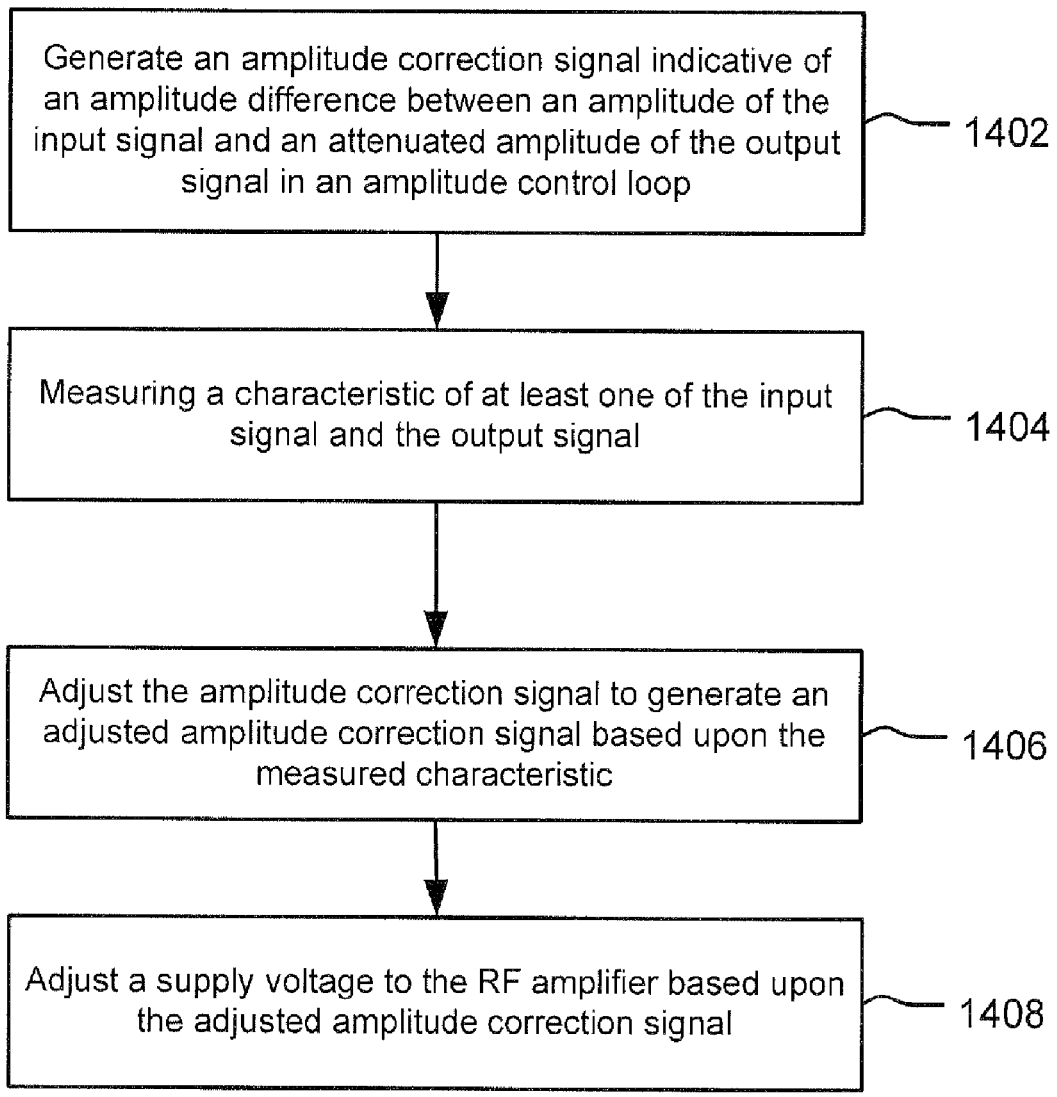
FIG. 15 illustrates an example of a method of operating an RF power amplifier system according to the fourth embodiment.

FIG. 15 illustrates an example of a method of operating an RF power amplifier system according to the fourth embodiment. In this example, the method includes generating an amplitude correction signal indicative of an amplitude difference between an amplitude of the input signal and an attenuated amplitude of the output signal in an amplitude control loop in 1402, measuring a characteristic of at least one of the input signal and the output signal in 1404, adjusting the amplitude correction signal to generate an adjusted amplitude correction signal based upon the measured characteristic in 1406, and adjusting a supply voltage to the RF amplifier based upon the adjusted amplitude correction signal in 1408.

As described above, a variety of circuits are capable of generating the amplitude correction signal. Thus generating the amplitude correction signal in 1402 can include detecting the amplitude of the input and output signals in detectors, coupling power from the input or output signals, attenuating the input and output signals, or the like.

Figure 16:
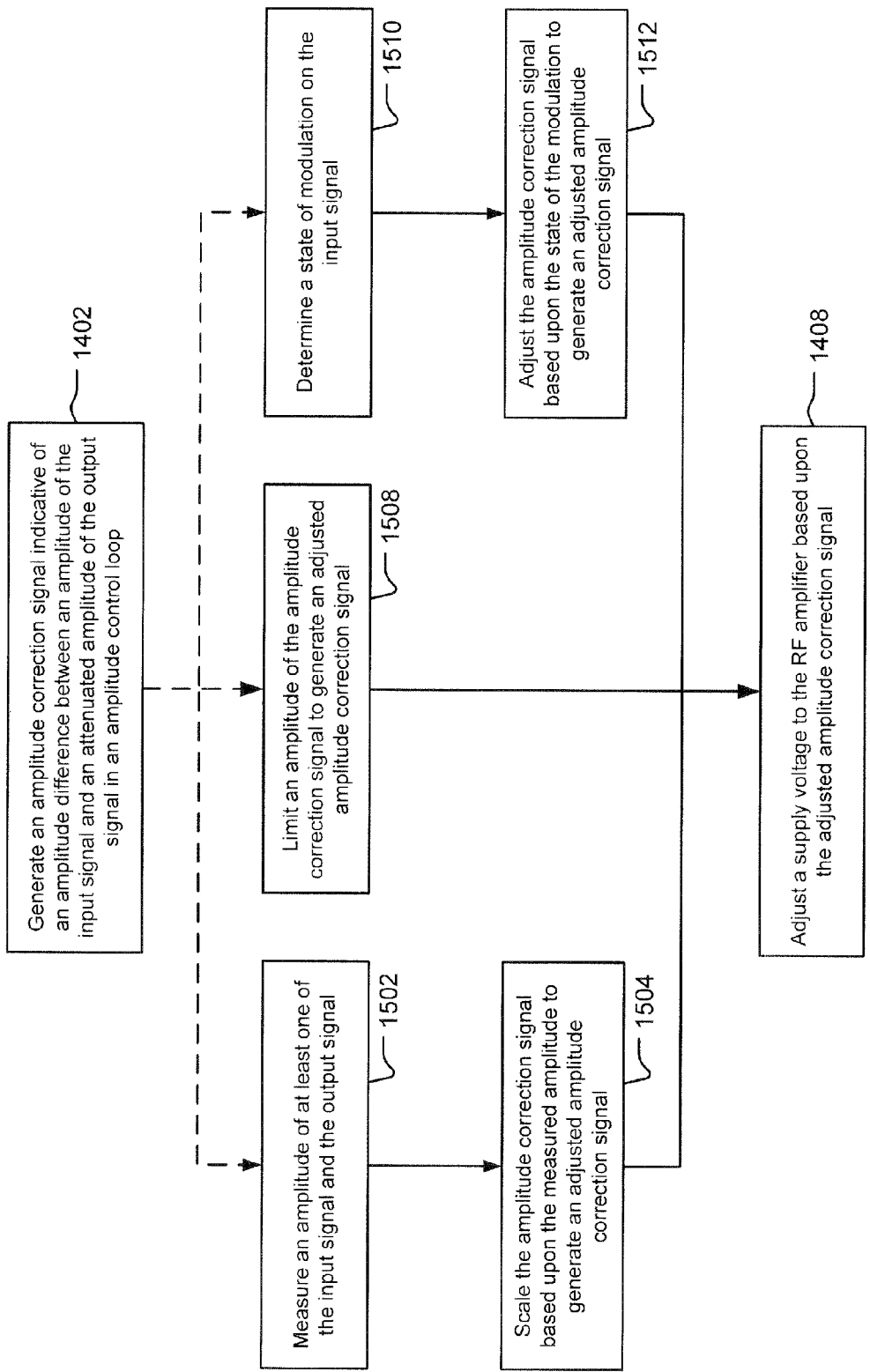
FIG. 16 illustrates examples of a method of operating an RF power amplifier system according to the fourth embodiment.

FIG. 16 illustrates examples of a method of operating an RF power amplifier system according to the fourth embodiment. Measuring the characteristic of at least one of the input signal and the output signal in 1404 includes a variety of techniques. In one example, the method includes measuring an amplitude of at least one of the input signal and the output signal in 1502, and scaling the amplitude correction signal based upon the measured amplitude in 1504 to generate an adjusted amplitude correction signal. Thus, the amplitude correction signal is adjusted in response to the input signal, the output signal, or both. As described above, such adjustment can include multiplying, scaling, adjusting gain of a VGA, controlling a switch, or the like.

In another example of a method of operating an RF power amplifier, the method includes limiting an amplitude of the amplitude correction signal in 1508 to generate an adjusted amplitude correction signal. As described above, by limiting the amplitude of the amplitude correction signal effectively reduces the gain of the amplitude loop. As a result, glitches introduced by rapid amplitude changes in the input signal are reduced.

In another example of a method of operating an RF power amplifier, the method includes determining a state of modulation on the input signal in 1510, and adjusting the amplitude correction signal based upon the state of the modulation in 1512 to generate an adjusted amplitude correction signal. As described above, the state of the modulation can have information about rapid amplitude changes and other transitions that can introduce distortion into the output signal. By adjusting the amplitude correction signal in 1512 in response to the modulation state, such distortions can be reduced.

Figure 17:
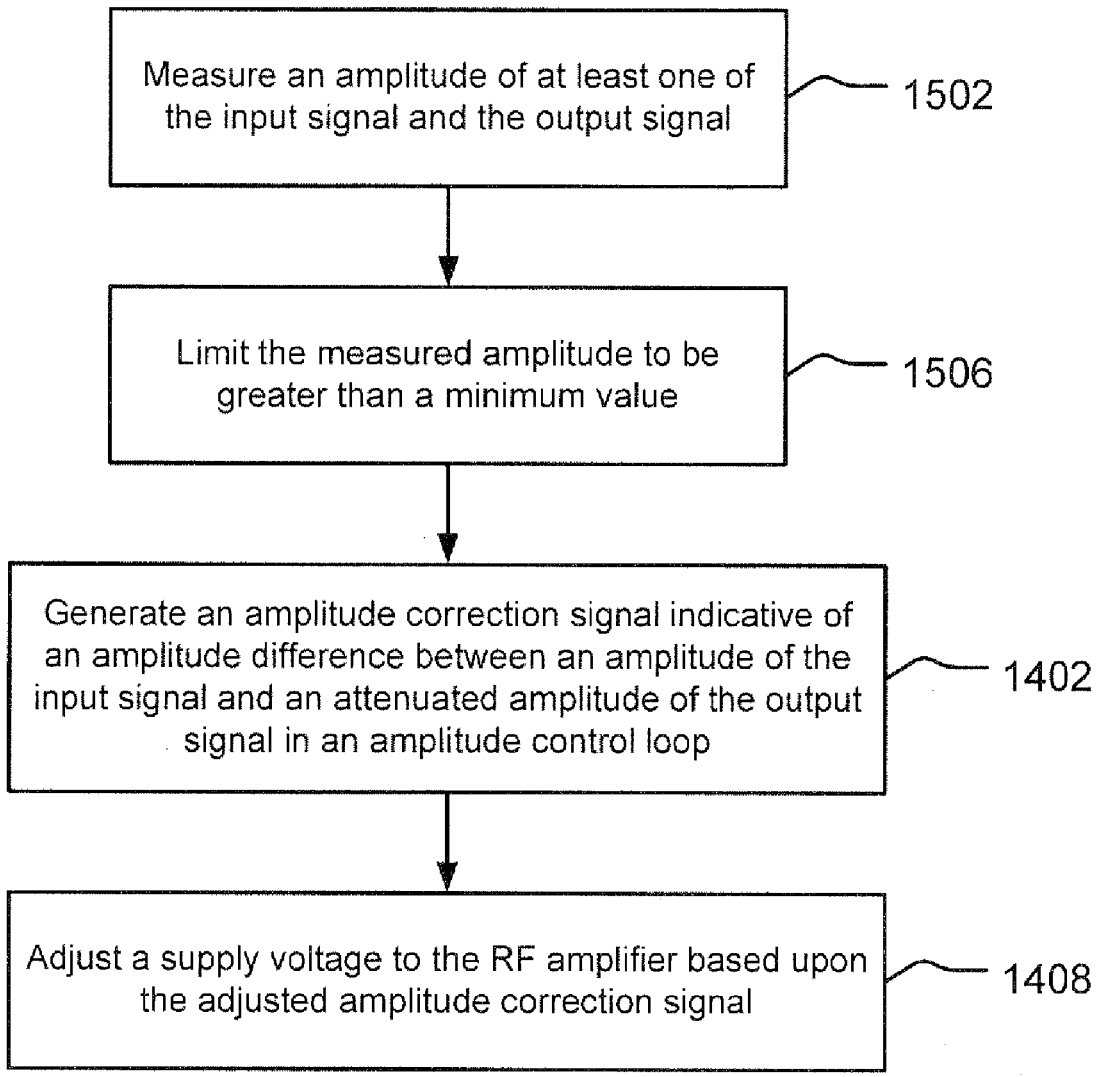
FIG. 17 illustrates an example of a method of operating an RF power amplifier system according to the fourth embodiment.

FIG. 17 illustrates an example of measuring the characteristic and adjusting the amplitude correction signal in FIG. 14. In this example, the method includes limiting the measured amplitude to be greater than a minimum value in 1506. As described above, the measured amplitude can be limited to be greater than a minimum value with amplitude adjust blocks. As can be seen in this example, the measured amplitude is limited before being used to generate the amplitude correction signal. The amplitude correction signal so generated is adjusted relative to an amplitude correction signal if there were no limiting of the measured amplitude. As a result, the amplitude correction signal is the adjusted amplitude correction signal.

Once an adjusted amplitude correction signal is generated, a supply voltage to the RF amplifier can be adjusted based upon the adjusted amplitude correction signal in 1408 as described above.

Another example includes a power amplifier controller circuit for controlling a power amplifier. The power amplifier coupled to receive and amplify an input signal to generate an output signal. The power amplifier controller circuit includes means for generating an amplitude correction signal indicative of an amplitude difference between an amplitude of the input signal and an attenuated amplitude of the output signal in an amplitude control loop, means for reducing an action of the amplitude control loop during rapid amplitude changes in the input signal, and means for adjusting a supply voltage to the RF amplifier based upon the amplitude correction signal.

In another example, the power amplifier controller circuit includes means for measuring a characteristic of at least one of the input signal and the output signal, and means for adjusting the amplitude correction signal to generate an adjusted amplitude correction signal based upon the measured characteristic.

In another example, the power amplifier controller circuit includes means for measuring an amplitude of at least one of the input signal the output signal, and means for scaling the amplitude correction signal based upon the measured amplitude to generate an adjusted amplitude correction signal.

In another example, the power amplifier controller circuit includes means for limiting the measured amplitude to be greater than a minimum value.

In another example, the power amplifier controller circuit includes means for limiting an amplitude of the amplitude correction signal to generate an adjusted amplitude correction signal.

In another example, the power amplifier controller circuit includes means for determining a state of modulation on the input signal, and means for adjusting the amplitude correction signal based upon the state of the modulation to generate an adjusted amplitude correction signal.

As described above, various circuits, systems, configurations, and the like have been described as part of a power amplifier controller circuit or power amplifier system. Such circuitry describes examples of the means for performing the functions described above.

In general, any combination of the above described systems may be implemented in one or more circuits. Referring to FIG. 10A, in one example, the loop gain adjust block 1008 is configured to generate an adjusted amplitude correction signal 1010 on an output in response to a characteristic of a signal on at least one of the inputs to the amplitude comparator 308. In FIG. 10A an output of an amplitude detector 323 adjusts the amplitude correction signal 309 in the loop gain adjust block 1008. Thus, the characteristic of the input to the amplitude comparator 308 is the amplitude of one or both of the amplitude of the input signal 204 and the output signal 110.

Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

The invention claimed is:

1. An RF power amplifier system, comprising:
    an RF power amplifier configured to receive and amplify an input signal to generate an output signal
    circuitry configured to measure a rate of change of an amplitude of the input signal and generate a control signal indicative of the measured rate of change of the amplitude of the input signal;
    an amplitude control loop to determine an amplitude correction signal indicative of an amplitude difference between an amplitude of the input signal and an attenuated amplitude of the output signal, and to adjust a supply voltage or bias to the power amplifier based upon the amplitude correction signal;
    a loop gain adjust block configured to adjust the amplitude correction signal to generate an adjusted amplitude correction signal responsive to the control signal indicative of the measured rate of change of the amplitude of the input signal; and
    where the amplitude control loop is configured to reduce a gain of the amplitude control loop during rapid amplitude changes in the input signal in response to the adjusted amplitude correction signal.

2. The RF power amplifier system of claim 1,
    where the amplitude control loop is configured to reduce the gain of the amplitude control loop during a decrease in the amplitude of at least one of the input signal and the output signal.

3. The RF power amplifier system of claim 2,
    where the amplitude control loop is configured to adjust the supply voltage or bias to the RF power amplifier based upon the adjusted amplitude correction signal.

4. The RF power amplifier system of claim 3, further comprising:
    a variable gain amplifier configured to adjust the amplitude of the input signal in response to the adjusted amplitude correction signal.

5. The RF power amplifier system of claim 3, where:
    the RF power amplifier has a gain responsive to the adjusted amplitude correction signal.

6. The RF power amplifier system of claim 2, where:
    the amplitude control loop is configured to determine the amplitude correction signal indicative of an amplitude difference between an adjusted amplitude of the input signal and an adjusted attenuated amplitude of the output signal;
    the adjusted amplitude of the input signal is the amplitude of the input signal with a lower limit below which the adjusted amplitude of the input signal does not follow the amplitude of the input signal; and the adjusted attenuated amplitude of the output signal is the attenuated amplitude of the output signal with another lower limit below which the adjusted attenuated amplitude of the output signal does not follow the attenuated amplitude of the output signal.

7. The RF power amplifier system of claim 6, further comprising:
a variable gain amplifier configured to adjust the amplitude of the input signal in response to the adjusted amplitude correction signal.

8. The RF power amplifier system of claim 6, where:
the RF power amplifier has a gain responsive to the adjusted amplitude correction signal.

9. An RF power amplifier system, comprising:
an RF power amplifier configured to receive and amplify an input signal to generate an output signal;
an amplitude control loop to determine an amplitude correction signal indicative of an amplitude difference between an amplitude of the input signal and an attenuated amplitude of the output signal, and to adjust a supply voltage or bias to the power amplifier based upon the amplitude correction signal; and
a switching circuit configured to pass the amplitude correction signal as an adjusted amplitude correction signal if at least one of the input signal and the output signal is greater than or equal to a threshold, and block the amplitude correction signal if at least one of the input signal and the output signal is below the threshold;
where the amplitude control loop is configured to adjust the supply voltage or bias to the RF power amplifier based upon the adjusted amplitude correction signal.

10. The RF power amplifier system of claim 9, further comprising:
a variable gain amplifier configured to adjust the amplitude of the input signal in response to the adjusted amplitude correction signal.

11. The RF power amplifier system of claim 9, where:
the RF power amplifier has a gain responsive to the adjusted amplitude correction signal.

12. An RF power amplifier system, comprising:
an RF power amplifier configured to receive and amplify an input signal to generate an output signal; and
a modulation state transition indicator circuit configured to generate a modulation state transition signal indicating a transition of modulation of the input signal through or near a constellation origin;
an amplitude control loop to determine an amplitude correction signal indicative of an amplitude difference between an amplitude of the input signal and an attenuated amplitude of the output signal, and to adjust a supply voltage or bias to the power amplifier based upon the amplitude correction signal;
a loop gain adjust block configured to adjust the amplitude correction signal to generate an adjusted amplitude correction signal in response to the modulation state transition signal indicating the transition of modulation of the input signal through or near the constellation origin; and
where the amplitude control loop is configured to reduce a gain of the amplitude control loop during transitions in a modulation state of the input signal modulation which pass through or near the constellation origin in response to the adjusted amplitude correction signal.

13. The RF power amplifier system of claim 12,
where the amplitude control loop is configured to adjust the supply voltage or bias to the RF power amplifier based upon the adjusted amplitude correction signal.

14. The RF power amplifier system of claim 13, where:
the RF power amplifier has a gain responsive to the adjusted amplitude correction signal.

15. The RF power amplifier system of claim 13, further comprising:
a variable gain amplifier configured to adjust the amplitude of the input signal in response to the adjusted amplitude correction signal.

16. The RF power amplifier system of claim 13, further comprising:
a digital signal processor including modulation information on the modulation of the input signal, and
wherein the modulation state transition circuit is configured to generate the modulation state transition signal in response to the modulation information.

17. The RF power amplifier system of claim 12,
where:
the amplitude control loop is configured to determine the amplitude correction signal indicative of an amplitude difference between an adjusted amplitude of the input signal and an adjusted attenuated amplitude of the output signal;
the adjusted amplitude of the input signal is the amplitude of the input signal adjusted in response to the modulation state transition signal; and
the adjusted attenuated amplitude of the output signal is the amplitude of the attenuated output signal adjusted in response to the modulation state transition signal.

18. The RF power amplifier system of claim 17, where:
the RF power amplifier has a gain responsive to the adjusted amplitude correction signal.

19. The RF power amplifier system of claim 17, further comprising:
a variable gain amplifier configured to adjust the amplitude of the input signal in response to the adjusted amplitude correction signal.

20. The RF power amplifier system of claim 17, further comprising:
a digital signal processor including modulation information on the modulation of the input signal, and
wherein the modulation state transition circuit is configured to generate the modulation state transition signal in response to the modulation information.

21. A method of controlling an RF power amplifier coupled to receive and amplify an input signal to generate an output signal, the method comprising:
measuring a rate of change of an amplitude of the input signal;
generating an amplitude correction signal indicative of an amplitude difference between an amplitude of the input signal and an attenuated amplitude of the output signal in an amplitude control loop;
adjusting the amplitude correction signal to generate an adjusted amplitude correction signal responsive to the measured rate of change of the amplitude of the input signal;
reducing a gain of an amplitude control loop during rapid amplitude changes in the input signal responsive to the adjusted amplitude correction signal; and
adjusting a supply voltage or bias to the RF amplifier based upon the amplitude correction signal.

* * * * *

UNITED STATES PATENT AND TRADEMARK OFFICE
CERTIFICATE OF CORRECTION

PATENT NO.       : 8,032,097 B2                                      Page 1 of 1
APPLICATION NO.  : 11/670402
DATED            : October 4, 2011
INVENTOR(S)      : Drogi et al.

It is certified that error appears in the above-identified patent and that said Letters Patent is hereby corrected as shown below:

Title page 1, column 1, item (63), under Related U.S. Application Data insert

--, now Pat. No 7,933,570-- after "Continuation-in-part of application No. 11/429,119, filed on May 4, 2006".

Signed and Sealed this
Twentieth Day of March, 2012

David J. Kappos
*Director of the United States Patent and Trademark Office*